United States Patent
Matsubara et al.

(12) 
(10) Patent No.: US 9,865,994 B2
(45) Date of Patent: Jan. 9, 2018

(54) VERTICAL CAVITY SURFACE EMITTING LASER ARRAY AND METHOD FOR MANUFACTURING THE SAME

(71) Applicant: MURATA MANUFACTURING CO., LTD., Kyoto-fu (JP)

(72) Inventors: Ippei Matsubara, Nagaokakyo (JP); Takayuki Kona, Nagaokakyo (JP); Keiji Iwata, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 15/002,607

(22) Filed: Jan. 21, 2016

(65) Prior Publication Data

US 2016/0156157 A1 Jun. 2, 2016

Related U.S. Application Data

(63) Continuation of application No. PCT/JP2014/063953, filed on May 27, 2014.

(30) Foreign Application Priority Data

Jul. 22, 2013 (JP) ................. 2013-151606

(51) Int. Cl.
*H01S 5/00* (2006.01)
*H01S 3/13* (2006.01)
(Continued)

(52) U.S. Cl.
CPC ............ *H01S 5/423* (2013.01); *H01S 5/0042* (2013.01); *H01S 5/0208* (2013.01);
(Continued)

(58) Field of Classification Search
CPC ........ H01S 5/423; H01S 5/187; H01S 5/0425; H01S 5/0208; H01S 5/4018; H01S 5/02276; H01S 5/0042; H01S 5/042; H01S 5/18311; H01S 2301/176; H01L 2224/24

See application file for complete search history.

(56) References Cited

U.S. PATENT DOCUMENTS 6,829,278 B1* 12/2004 Allenson ............... H01S 5/4025
372/25
2006/0109883 A1 5/2006 Lewis et al.
(Continued)

FOREIGN PATENT DOCUMENTS

JP 60-080291 A 5/1985
JP 63-306687 A 12/1988
(Continued)

OTHER PUBLICATIONS

International Search Report—PCT/JP2014/063953 dated Aug. 26, 2014.
(Continued)

*Primary Examiner* — Yuanda Zhang
(74) *Attorney, Agent, or Firm* — Studebaker & Brackett PC

(57) ABSTRACT

A VCSEL array includes a base substrate, a plurality of VCSEL devices and an inter-device line. Each of the plurality of VCSEL devices is disposed on a front side of the base substrate. The inter-device line connects two of the plurality of VCSEL devices that are adjacent to each other, the two VCSEL devices being connected in series such that forward directions of the two VCSEL devices are the same. An insulating groove that electrically insulates the two VCSEL devices is formed on the base substrate.

16 Claims, 19 Drawing Sheets

(51) Int. Cl.
- *H01S 5/42* (2006.01)
- *H01S 5/022* (2006.01)
- *H01S 5/40* (2006.01)
- *H01S 5/02* (2006.01)
- *H01S 5/187* (2006.01)
- *H01S 5/042* (2006.01)
- *H01S 5/183* (2006.01)

(52) U.S. Cl.
CPC ........ *H01S 5/02276* (2013.01); *H01S 5/0425* (2013.01); *H01S 5/187* (2013.01); *H01S 5/4018* (2013.01); H01L 2224/24 (2013.01); *H01S 5/042* (2013.01); *H01S 5/18311* (2013.01); H01S 2301/176 (2013.01)

(56) References Cited

U.S. PATENT DOCUMENTS

2006/0151793 A1* 7/2006 Nagai .................... H01L 23/16 257/79
2012/0139566 A1* 6/2012 Shimazawa ............ G11B 5/105 324/750.01

FOREIGN PATENT DOCUMENTS

| JP | 10-229250 A | 8/1998 |
| JP | 2006-066845 A | 3/2006 |
| JP | 2008-508730 A | 3/2008 |
| WO | 2010/084890 A1 | 7/2010 |

OTHER PUBLICATIONS

Written Opinion—PCT/JP2014/063953 dated Aug. 26, 2014.
International Preliminary Report on Patentability of the International Searching Authority; PCT/JP2014/063953 dated Jan. 26, 2016.
Look, David C. "The electrical characterization of semi-insulating GaAs: A correlation with mass-spectrographic analysis." Journal of Applied Physics 48.12 (Dec. 1977): 5141-5148.

* cited by examiner

VERTICAL CAVITY SURFACE EMITTING LASER ARRAY AND METHOD FOR MANUFACTURING THE SAME

CROSS REFERENCE TO RELATED APPLICATIONS

This application claims benefit of priority to Japanese Patent Application 2013-151606 filed Jul. 22, 2013, and to International Patent Application No. PCT/JP2014/063953 filed May 27, 2014, the entire content of which is incorporated herein by reference.

TECHNICAL FIELD

The present disclosure relates to a vertical cavity surface emitting laser array and a method for manufacturing the same.

BACKGROUND

In general, the manufacture of semiconductor devices involves a so-called burn-in test, which is an accelerated test in which thermal and voltage loads are applied. If a characteristic value of a certain semiconductor device fails to meet predetermined standards as a result of the burn-in test, that semiconductor device is regarded as initially defective and excluded from the group of non-defective items.

In a vertical cavity surface emitting laser device, light is emitted perpendicularly to a semiconductor substrate. Therefore, a plurality of vertical cavity surface emitting laser devices may be subjected to the burn-in test while being arranged in an array on a wafer. Such a burn-in test is called a wafer level burn-in (WLBI).

There is a demand for technologies that realize accurate and low-cost WLBI for vertical cavity surface emitting laser arrays. For example, in a surface-emitting-type wafer disclosed in Japanese Unexamined Patent Application Publication No. 2006-66845), a plurality of surface-emitting-type elements are connected in series such that forward directions of light emitting element portions are the same.

SUMMARY

To perform an accurate burn-in test, all of the vertical cavity surface emitting laser devices on the wafer need to be tested under the same load conditions. A load current value is one of the most important parameters in burn-in tests of vertical cavity surface emitting laser devices. Therefore, the vertical cavity surface emitting laser devices are required to receive currents of a uniform load current value.

However, in the surface-emitting-type wafer disclosed in Japanese Unexamined Patent Application Publication No. 2006-66845, a semiconductor substrate includes a conductive semiconductor layer. Therefore, when a load current flows through the surface-emitting-type elements connected in series, there is a possibility that part of the load current will leak through the conductive semiconductor layer. In such a case, the surface-emitting-type elements connected in series may not be able to receive a uniform load current.

An object of the present disclosure is to provide a vertical cavity surface emitting laser array configured so as to realize an accurate and low-cost burn-in test and a method for manufacturing the vertical cavity surface emitting laser array.

Solution to Problem

A surface emitting laser array according to an aspect of the present disclosure includes a semiconductor substrate, a plurality of vertical cavity surface emitting laser devices, and an inter-device line. The plurality of vertical cavity surface emitting laser devices are formed on a front side of the semiconductor substrate. The inter-device line connects two of the plurality of vertical cavity surface emitting laser devices that are adjacent to each other, the two vertical cavity surface emitting laser devices being connected in series such that forward directions of the two vertical cavity surface emitting laser devices are the same. An insulating region that electrically insulates the two vertical cavity surface emitting laser devices is formed on the semiconductor substrate.

Preferably, the semiconductor substrate is semi-insulating. The insulating region is shaped so as to be recessed into the semiconductor substrate from the front side of the semiconductor substrate.

Preferably, an insulation protection film is formed on a front surface of an insulating groove.

Preferably, the insulation protection film is a film made of silicon nitride.

Preferably, the insulating groove has a forward tapered shape such that a cross sectional area of the insulating groove decreases along a direction from the front side to a back side of the semiconductor substrate.

Preferably, the semiconductor substrate is semi-insulating. The insulating region is a high resistance region having an electrical resistivity higher than an electrical resistivity of the semiconductor substrate. The high resistance region is formed to divide a layer that is provided on the semiconductor substrate and on which the two vertical cavity surface emitting laser devices are formed.

Preferably, each of the plurality of vertical cavity surface emitting laser devices includes an active region, and a first-conductivity-type semiconductor multilayer-film reflective layer and a second-conductivity-type semiconductor multilayer-film reflective layer that sandwich the active region. The second-conductivity-type semiconductor multilayer-film reflective layer is provided between the first-conductivity-type semiconductor multilayer-film reflective layer and the semiconductor substrate. The semiconductor substrate includes a first-conductivity-type conductive semiconductor layer formed so as to extend from the front surface toward a back side of the semiconductor substrate. The insulating region is an insulating groove that is shaped so as to be recessed into the first-conductivity-type conductive semiconductor layer from the front side of the semiconductor substrate.

Preferably, each of the plurality of vertical cavity surface emitting laser devices includes an active region, and a first-conductivity-type semiconductor multilayer-film reflective layer and a second-conductivity-type semiconductor multilayer-film reflective layer that sandwich the active region. The second-conductivity-type semiconductor multilayer-film reflective layer is provided between the first-conductivity-type semiconductor multilayer-film reflective layer and the semiconductor substrate. The semiconductor substrate includes a first-conductivity-type conductive semiconductor layer formed so as to extend from the front surface toward a back side of the semiconductor substrate. The insulating region includes a high resistance region having an electrical resistivity higher than an electrical resistivity of the first-conductivity-type conductive semiconductor layer. The high resistance region is formed to divide the first-conductivity-type conductive semiconductor layer.

A method for manufacturing a vertical cavity surface emitting laser array according to another aspect of the present disclosure includes a step of forming a plurality of vertical cavity surface emitting laser devices on a front side of a semiconductor substrate; a step of forming an insulating region between two of the plurality of vertical cavity surface emitting laser devices that are adjacent to each other, the insulating region extending into the semiconductor substrate from the front side of the semiconductor substrate and electrically insulating the two vertical cavity surface emitting laser devices; and a step of forming an inter-device line after the step of forming the insulating region, the inter-device line connecting the two vertical cavity surface emitting laser devices in series such that forward directions of the two vertical cavity surface emitting laser devices are the same.

Preferably, the semiconductor substrate is semi-insulating. The step of forming the insulating region includes a step of forming an insulating groove that is shaped so as to be recessed into the semiconductor substrate from the front side of the semiconductor substrate.

Preferably, the semiconductor substrate is semi-insulating. The step of forming the insulating region includes a step of forming a high resistance region by ion implantation to divide a layer that is provided on the semiconductor substrate and on which the two vertical cavity surface emitting laser devices are formed, the high resistance region having an electrical resistivity higher than an electrical resistivity of the semiconductor substrate.

Preferably, the manufacturing method further includes a step of performing a burn-in test in which a load current is supplied to the two vertical cavity surface emitting laser devices through the inter-device line; and a step of removing the inter-device line after the step of performing the burn-in test.

Preferably, each of the plurality of vertical cavity surface emitting laser devices includes an anode electrode and a cathode electrode; an anode electrode pad and a cathode electrode pad formed for wire bonding; an anode wire that electrically connects the anode electrode and the anode electrode pad; and a cathode wire that electrically connects the cathode electrode and the cathode electrode pad. The step of forming the inter-device line includes a step of forming the anode electrode pad, the cathode electrode pad, the anode wire, and the cathode wire together with the inter-device line.

Preferably, the step of forming the inter-device line includes a step of forming the inter-device line by at least one of sputtering film formation or plating.

Advantageous Effects of Disclosure

The present disclosure provides a vertical cavity surface emitting laser array configured so as to realize an accurate and low-cost burn-in test.

DETAILED DESCRIPTION

Figure 1:
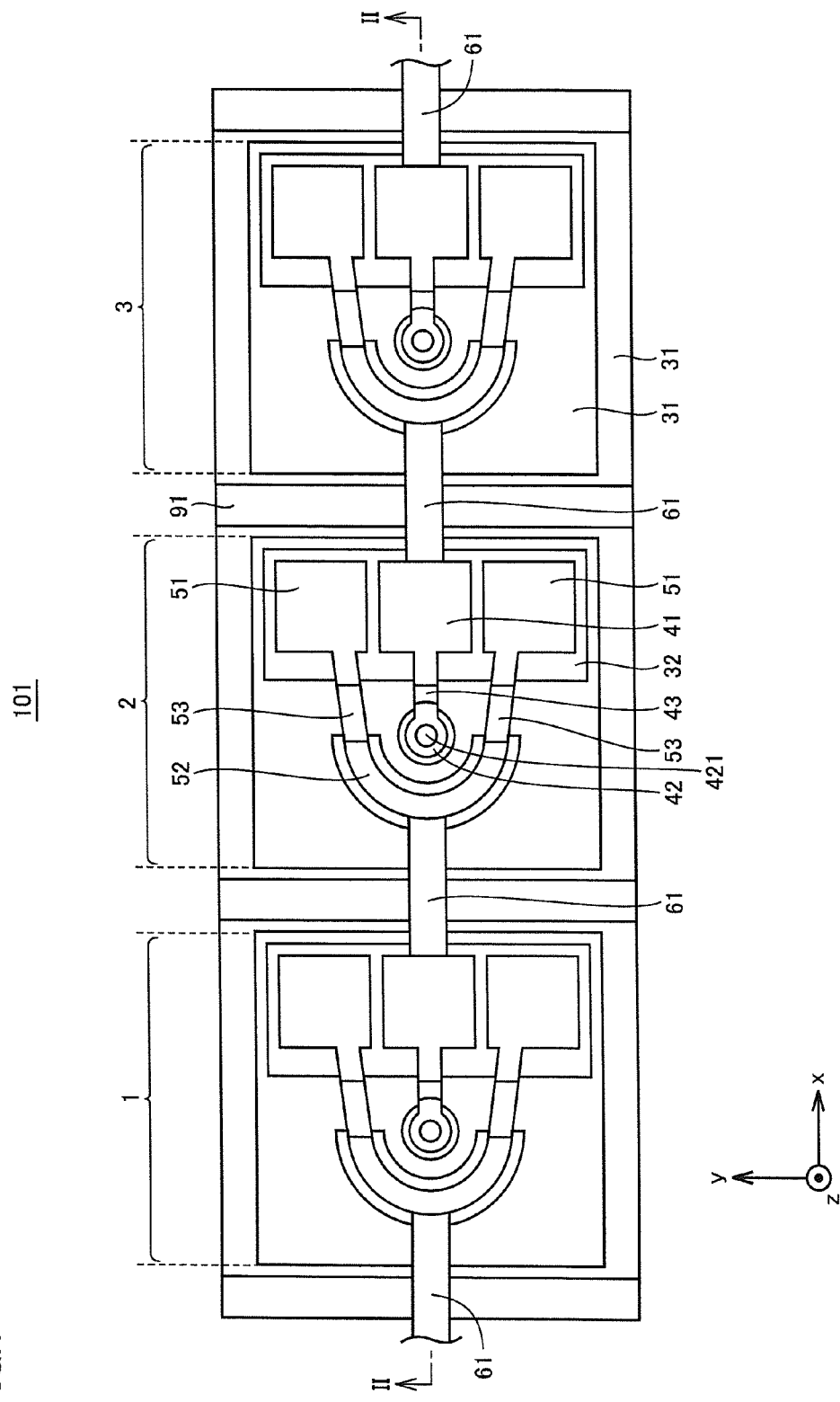
FIG. 1 is a plan view of a vertical cavity surface emitting laser array according to a first embodiment of the present disclosure.

Embodiments of the present disclosure will now be described in detail with reference to the drawings. In the drawings, the same or corresponding components are denoted by the same reference numerals, and description thereof will not be repeated. Components are illustrated schematically in the drawings, and the sizes thereof are not limited to those illustrated in the drawings.

First Embodiment

Figure 2:
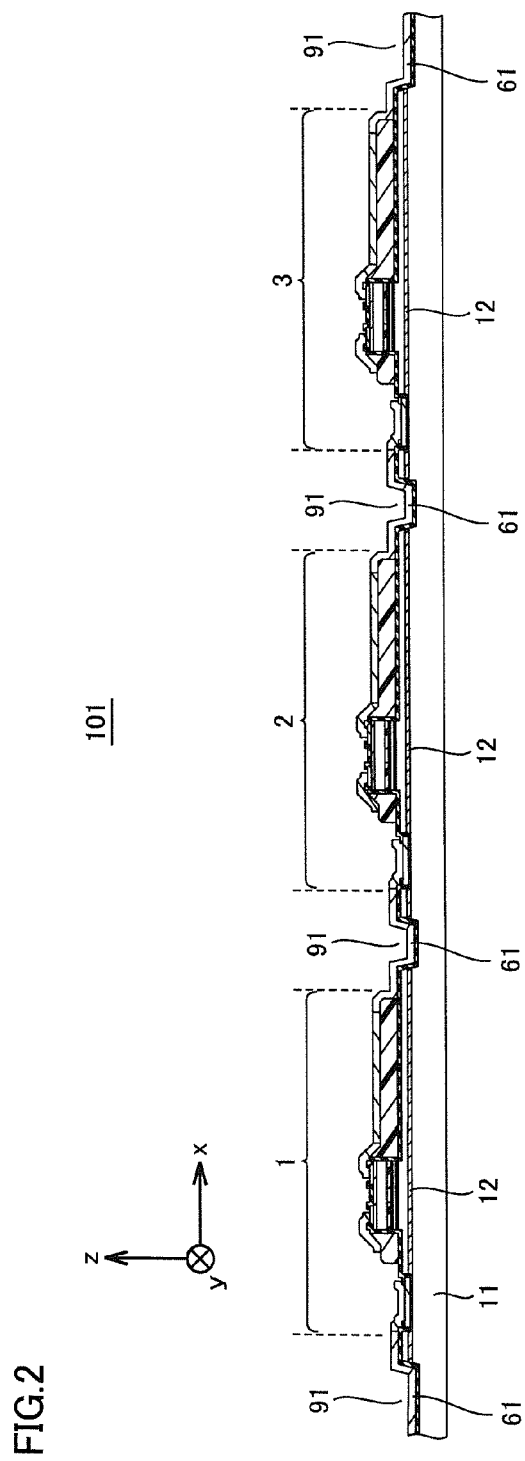
FIG. 2 is a sectional view of the vertical cavity surface emitting laser array taken along line II-II in FIG. 1.

FIG. 1 is a plan view of a vertical cavity surface emitting laser (VCSEL) array according to a first embodiment of the present disclosure. FIG. 2 is a sectional view of the VCSEL array taken along line II-II in FIG. 1.

Referring to FIGS. 1 and 2, a VCSEL array 101 includes three VCSEL devices 1 to 3. The three VCSEL devices 1 to 3 are connected in series by inter-device lines 61. The three VCSEL devices 1 to 3 have the same structure. The structure of the VCSEL device 2 will now be described as a representative.

Figure 3:
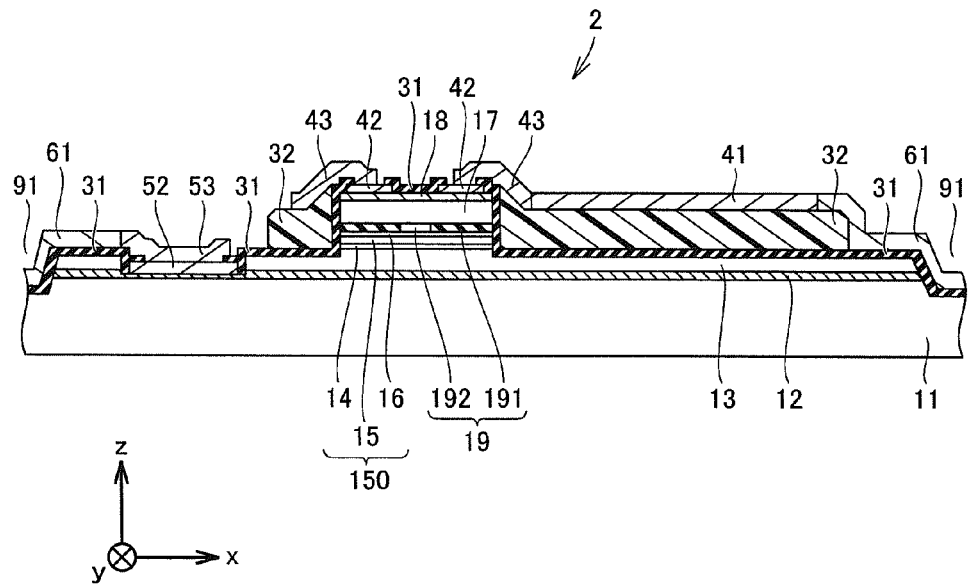
FIG. 3 is an enlarged sectional view of a vertical cavity surface emitting laser device illustrated in FIG. 2.

FIG. 3 is an enlarged sectional view of the VCSEL device 2 illustrated in FIG. 2. Referring to FIGS. 1 to 3, the VCSEL device 2 includes a base substrate 11, an n-type semiconductor contact layer (n-type contact layer) 12, an n-type semiconductor multilayer-film reflective layer (n-type distributed Bragg reflector (DBR) layer) 13, an n-type semiconductor cladding layer (n-type cladding layer) 14, an active layer 15, a p-type semiconductor cladding layer (p-type cladding layer) 16, a p-type semiconductor multi-layer-film reflective layer (p-type DBR layer) 17, a p-type semiconductor contact layer (p-type contact layer) 18, a current constriction layer 19, an anode electrode pad 41, an anode ohmic electrode 42, an anode wiring line 43, cathode electrode pads 51, a cathode ohmic electrode 52, and cathode wiring lines 53.

An insulating groove 91 and an inter-device line 61 are formed between the VCSEL device 1 and the VCSEL device 2 and between the VCSEL device 2 and the VCSEL device 3. The direction from a back side to a front side of the base substrate 11 is defined as the z direction, and the positive z direction is defined as the upward direction.

In the present embodiment, the material of the base substrate 11 is an n-type compound semiconductor that is semi-insulating. The base substrate 11 may be, for example, an n-type gallium arsenide (GaAs) substrate having an electrical resistivity of $1.0\times10^7$ Ω·cm or more. The base substrate 11 corresponds to the "semiconductor substrate" according to the present disclosure.

The n-type contact layer 12 is formed on the base substrate 11. The material of the n-type contact layer 12 is an n-type conductive compound semiconductor. The n-type contact layer 12 is formed to achieve a reliable ohmic contact between the n-type DBR layer 13 and the cathode ohmic electrode 52.

The n-type DBR layer 13 is formed on the n-type contact layer 12. The material of the n-type DBR layer 13 is an n-type conductive compound semiconductor, such as aluminum gallium arsenide (AlGaAs). Silicon (Si), for example, is introduced at $2\times10^{18}$ cm$^{-3}$ as an impurity for imparting n-type conductivity.

The n-type DBR layer 13 includes high-refractive-index layers and low-refractive-index layers (neither is illustrated) that are alternately stacked. The thickness of each layer is λ/4 (λ is the wavelength in the medium). The high-refractive-index layers and the low-refractive-index layers have different composition ratios of Al to Ga. The compositions of the high-refractive-index layers and the low-refractive-index layers are respectively expressed as, for example, n-$Al_{0.9}Ga_{0.1}As$ and n-$Al_{0.12}Ga_{0.88}As$. Thirty to forty pairs of layers, each pair including a single high-refractive-index layer and a single low-refractive-index layer, are formed.

The n-type cladding layer 14 is formed on the n-type DBR layer 13. The material of the n-type cladding layer 14 is an n-type conductive compound semiconductor.

The active layer 15 is formed on the n-type cladding layer 14. The active layer 15 is a non-doped region in which no impurities are introduced. For example, the active layer 15 has a multi quantum well (MQW) structure in which quantum well layers and barrier layers (neither is shown) are alternately stacked.

The p-type cladding layer 16 is formed on the active layer 15. The material of the p-type cladding layer 16 is a p-type conductive compound semiconductor.

In the present embodiment, the n-type cladding layer 14, the active layer 15, and the p-type cladding layer 16 form an active region 150 in which light is generated. The thickness and material of each layer in the active region 150 are appropriately determined in accordance with an oscillation wavelength (for example, 850 nm). For example, the quantum well layers and the barrier layers included in the active layer 15 are made of GaAs and AlGaAs, respectively, and the n-type DBR layer 13 and the p-type cladding layer 16 are made of AlGaAs.

However, the structure of the "active region" according to the present disclosure is not limited to this. For example, the cladding layers may be omitted. Alternatively, a cladding layer may be formed only at one side of the active layer. Namely, the n-type cladding layer 14 and the p-type cladding layer 16 are not essential.

The p-type DBR layer 17 is formed on the p-type cladding layer 16. The material of the p-type DBR layer 17 is a p-type conductive compound semiconductor, such as AlGaAs. Carbon (C), for example, is introduced at $2\times10^{18}$ cm$^{-3}$ as an impurity for imparting p-type conductivity.

The structure of the p-type DBR layer 17 differs from the structure of the n-type DBR layer 13 in that the number of pairs of layers, each pair including a high-refractive-index layer and a low-refractive-index layer, is smaller than that in the n-type DBR layer 13. The number of pairs of layers included in the n-type DBR layer 13 is 30 to 40, and the number of pairs of layers included in the p-type DBR layer 17 is, for example, 20. Thus, the p-type DBR layer 17 is formed such that the reflectivity thereof is somewhat lower than that of the n-type DBR layer 13. The structure of the p-type DBR layer 17 is the same as that of the n-type DBR layer 13 in other respects, and detailed description thereof will not be repeated.

The p-type contact layer 18 is formed on the p-type DBR layer 17. The material of the p-type contact layer 18 is a p-type conductive compound semiconductor. The p-type contact layer 18 is formed to achieve a reliable ohmic contact between the p-type DBR layer 17 and the anode ohmic electrode 42.

The p-type DBR layer 17 may serve also as the p-type contact layer 18, and the n-type DBR layer 13 may serve also as the n-type contact layer 12. In other words, the p-type contact layer 18 and the n-type contact layer 12 are not essential.

The current constriction layer 19 is formed on the boundary plane between the p-type cladding layer 16 and the p-type DBR layer 17. The current constriction layer 19 includes an oxidized region 191 and a non-oxidized region 192. The oxidized region 191 is formed by oxidizing the current constriction layer 19 from the side surfaces toward the center. The non-oxidized region 192 is a substantially central region of the current constriction layer 19 in which the current constriction layer 19 is left non-oxidized. The material of the oxidized region 191 is, for example, AlGaAs. The composition of the oxidized region 191 is set such that the composition ratio of Al to Ga is higher than those in other layers, and is expressed as, for example, $Al_{0.95}Ga_{0.05}As$.

Since the current constriction layer 19 is formed, a current that flows from the p-type DBR layer 17 to the n-type DBR layer 13 can be locally concentrated such that the current passes through the active region 150. Accordingly, oscillation occurs even when the current is low, and high light emission efficiency can be achieved. Thus, the power consumption of the VCSEL device can be reduced.

The anode ohmic electrode 42 is formed on the p-type contact layer 18 so as to be electrically connected to the p-type contact layer 18. In a plan view of the xy plane viewed in the z direction, the anode ohmic electrode 42 is, for example, an annular electrode (see FIG. 1). The light generated in the active region 150 is emitted to the outside through an emission opening 421 at the center of the anode ohmic electrode 42. The shape of the anode ohmic electrode 42 is not limited to an annular shape, and may instead be a rectangular shape or a C-shape obtained by cutting a portion of an annular shape.

A region in which the n-type DBR layer 13 is not formed is provided on the n-type contact layer 12 at a location near the region in which the n-type cladding layer 14 is formed. The cathode ohmic electrode 52 is formed in this region so as to be electrically connected to the n-type contact layer 12. In a plan view of the xy plane viewed in the z direction, the cathode ohmic electrode 52 is, for example, an arc-shaped electrode. The anode ohmic electrode 42 and the cathode ohmic electrode 52 respectively correspond to the "anode electrode" and "cathode electrode" according to the present disclosure.

In addition, in the present embodiment, the insulating grooves 91, which are shaped so as to be recessed into the base substrate 11 from the front side of the base substrate 11, are formed between the VCSEL devices 1 to 3. In other words, the insulating grooves 91 divide the layers on the base substrate 11 on which the VCSEL devices 1 to 3 are formed. The layers divided by the insulating grooves 91 are conductive or semiconductive semiconductor layers formed on the base substrate 11. In the present embodiment, the n-type contact layer 12 and the n-type DBR layer 13 correspond to these layers.

Since the base substrate 11 is composed of a semi-insulating semiconductor substrate, the VCSEL devices 1 to 3 are electrically insulated from each other. Moreover, since the insulating grooves 91 are formed, the electrical insulation (isolation) between the VCSEL devices that are adjacent to each other with the insulating grooves 91 provided therebetween can be further enhanced.

The insulation protection film 31 is formed so as to cover the front surface of each of the above-described structural components other than the anode ohmic electrode 42 and the cathode ohmic electrode 52. The insulation protection film 31 is, for example, a film made of silicon nitride (SiN). In the case where silicon nitride is selected as the material of the insulation protection film 31, the membrane stress of the insulation protection film 31 is adjustable. Moreover, films made of silicon nitride are highly moisture resistant.

The insulating layer 32 is formed on the insulation protection film 31 so as to surround the layers between the p-type contact layer 18 and the n-type cladding layer 14. The material of the insulating layer 32 is, for example, an insulating resin such as polyimide.

The anode electrode pad 41 is formed on the insulating layer 32 such that the anode electrode pad 41 is disposed between two cathode electrode pads 51. The electrode pads (anode electrode pad 41 and cathode electrode pads 51) are formed for wire bonding. The anode electrode pad 41 is electrically connected to the anode ohmic electrode 42 by the anode wiring line 43. The cathode electrode pads 51 are electrically connected to the cathode ohmic electrode 52 by the cathode wiring lines 53. The anode wiring line 43 and the cathode wiring lines 53 respectively correspond to the "anode wire" and "cathode wire" according to the present disclosure.

The electrode pads are formed on the insulating layer 32 having a certain thickness so that the parasitic capacitance generated between the electrode pads and the n-type DBR layer 13 can be reduced. Accordingly, when drive signals (not shown) are input to the electrode pads of the VCSEL devices 1 to 3, distortion of the waveforms of the drive signals can be suppressed. However, the insulating layer 32 may be omitted.

The inter-device lines 61 are formed to connect the VCSEL devices 1 to 3 in series. The inter-device lines 61 electrically connect the cathode ohmic electrode 52 of the VCSEL device 3 to the anode ohmic electrode 42 of the VCSEL device 2, and the cathode ohmic electrode 52 of the VCSEL device 2 to the anode ohmic electrode 42 of the VCSEL device 1. In other words, the inter-device lines 61 connect the VCSEL devices 1 to 3 in series such that forward directions thereof are the same.

Figure 4:
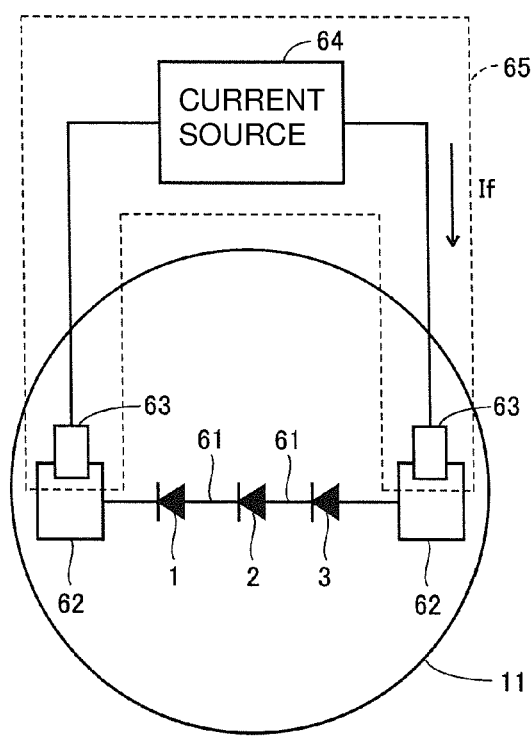
FIG. 4 is a schematic circuit diagram illustrating the structure of the vertical cavity surface emitting laser array illustrated in FIG. 1 in a burn-in test.

FIG. 4 is a schematic circuit diagram illustrating the structure of the VCSEL array 101 illustrated in FIG. 1 in a burn-in test. Referring to FIG. 4, a burn-in device 65 includes a current source 64 and a pair of probes 63. The current source 64 supplies a load current If that flows between the probes 63. A pair of dummy pads 62 are formed at both ends of the VCSEL array 101. The probes 63 are electrically connected to the dummy pads 62.

Since the dummy pads 62 are formed, it is not necessary to bring the probes 63 into physical contact with the electrode pads (see FIG. 1). Therefore, the electrode pads are prevented from being damaged. The size of the dummy pads 62 is preferably larger than that of the electrode pads, which are typically smaller than 100 μm×100 μm, and may be, for example, 200 μm×200 μm or more so that the probes 63 can be easily brought into contact with the dummy pads 62.

When a voltage is applied between the dummy pads 62, the load current If can be supplied to the VCSEL devices 1 to 3, which are connected in series, at the same time. Therefore, the number of probes can be reduced from that in the case where the load current is supplied to each VCSEL device individually. Thus, the cost of the burn-in device can be reduced.

FIGS. 1 to 4 illustrate the case in which the VCSEL array 101 includes three VCSEL devices. However, the number of VCSEL devices is not particularly limited. The number of VCSEL devices may be determined as appropriate in accordance with the specifications of the burn-in device 65, such as the number of probes 63, the value of the load current If that can be supplied by the current source 64, or a load voltage value.

Figure 5A:
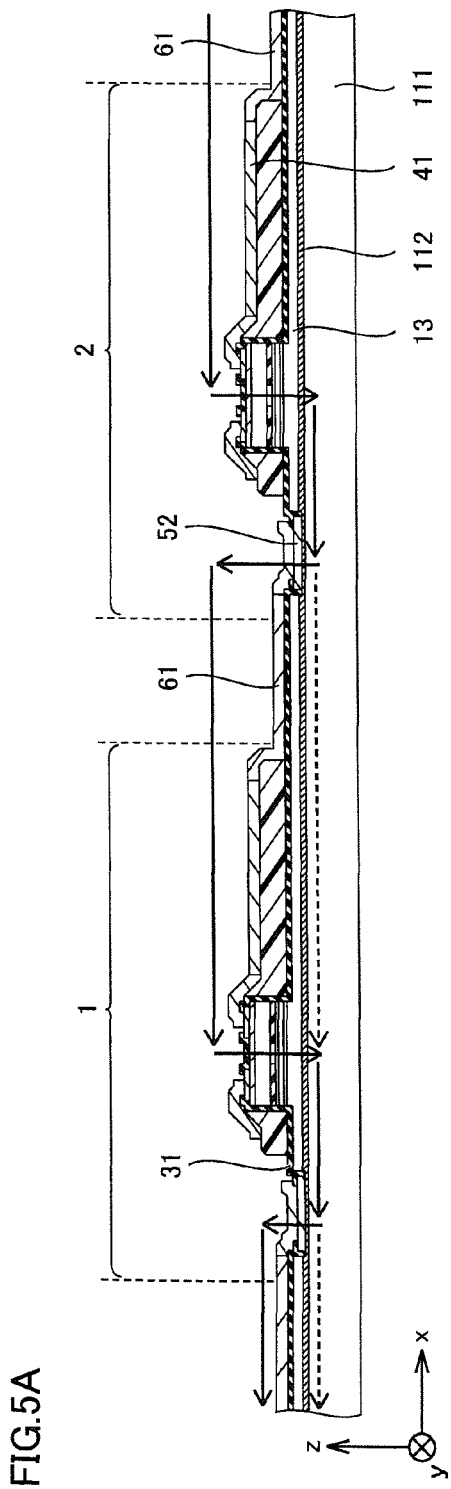
FIG. 5A illustrates a path of a load current in a vertical cavity surface emitting laser array for comparison.
Figure 5B:
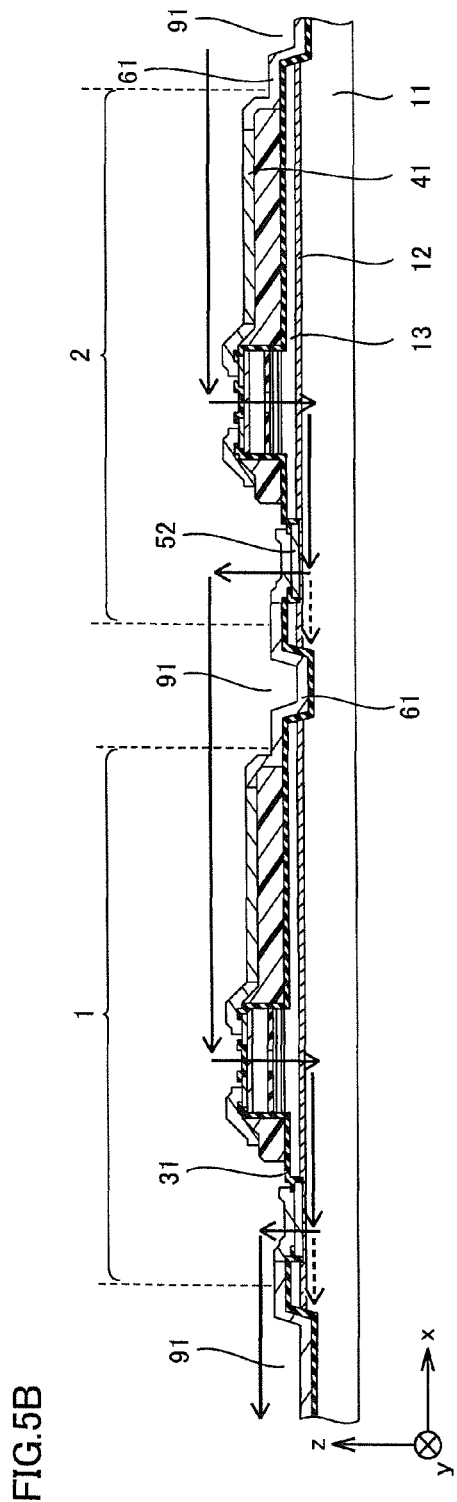
FIG. 5B illustrates a path of a load current in the vertical cavity surface emitting laser array illustrated in FIG. 2.

FIG. 5A illustrates a path of the load current If (shown by solid arrows) in a VCSEL array for comparison. FIG. 5B illustrates a path of the load current If in the VCSEL array 101 illustrated in FIG. 2.

The structure of the VCSEL array illustrated in FIG. 5A differs from that of the VCSEL array 101 in that a base substrate 111 is provided instead of the base substrate 11, an n-type conductive semiconductor layer 112 is provided instead of the n-type contact layer 12, and the insulating grooves 91 are not provided. The type (conductivity) of the base substrate 111 is not limited to the semi-insulating type. The structures of other portions of the VCSEL array illustrated in FIG. 5A are the same as those of the corresponding portions of the VCSEL array 101, and detailed description thereof will not be repeated.

Referring to FIGS. 1 to 3 and 5A, the load current If is supplied to the anode electrode pad 41 of the VCSEL device 2 through the corresponding inter-device line 61. In the VCSEL device 2, the load current If flows to the n-type conductive semiconductor layer 112 along the path that passes through the anode electrode pad 41, the anode wiring line 43, the anode ohmic electrode 42, the p-type contact layer 18, the p-type DBR layer 17, the current constriction layer 19, the p-type cladding layer 16, the active layer 15, the n-type cladding layer 14, and the n-type DBR layer 13. Then, the load current If is supplied to the VCSEL device 1 along the path that passes through the n-type conductive semiconductor layer, the cathode ohmic electrode 52, and the corresponding inter-device line 61.

In the structure illustrated in FIG. 5A, the VCSEL devices are connected to each other by the n-type conductive semiconductor layer 112 formed on the base substrate 111. Therefore, not all of the load current If that reaches the n-type contact layer 12 flows into the cathode ohmic electrode 52. A portion of the load current If flows through the n-type conductive semiconductor layer 112 and leaks to the VCSEL device 1 as a leak current (shown by a dashed arrow). Therefore, the VCSEL devices may not be able to receive a uniform load current.

In contrast, referring to FIGS. 1 to 3 and 5B, according to the present embodiment, the electrical insulation between the adjacent VCSEL devices is enhanced by the semi-insulating base substrate 11 and the insulating grooves 91. Accordingly, a leak current does not easily flow through a conductive or semiconductive semiconductor layer on the base substrate 11. This enables the VCSEL devices to receive a uniform load current If at the same time. Therefore, all of the VCSEL devices can be subjected to an accurate burn-in test under the same load conditions (load current conditions).

The magnitude of the leak current may be suppressed to less than 0.1% of the magnitude of the load current If by appropriately determining the material and electrical resistivity of the base substrate 11 and the shape of the insulating grooves 91 (for example, the depth and width of the grooves). This will be described in more detail by using a numerical expression. A leak current $I_{Leak}$ defined as below satisfies Relational Expression (1).

$$I_{Leak} \equiv (Vf \times n)/R_{ISO} < If \times 0.1\% \quad (1)$$

Here, Vf is the value of the load voltage applied to each of the VCSEL devices connected in series, n is the number of VCSEL devices that are connected in series, and $R_{ISO}$ is the resistance value of each insulating groove 91 between two adjacent VCSEL devices.

Figure 6:
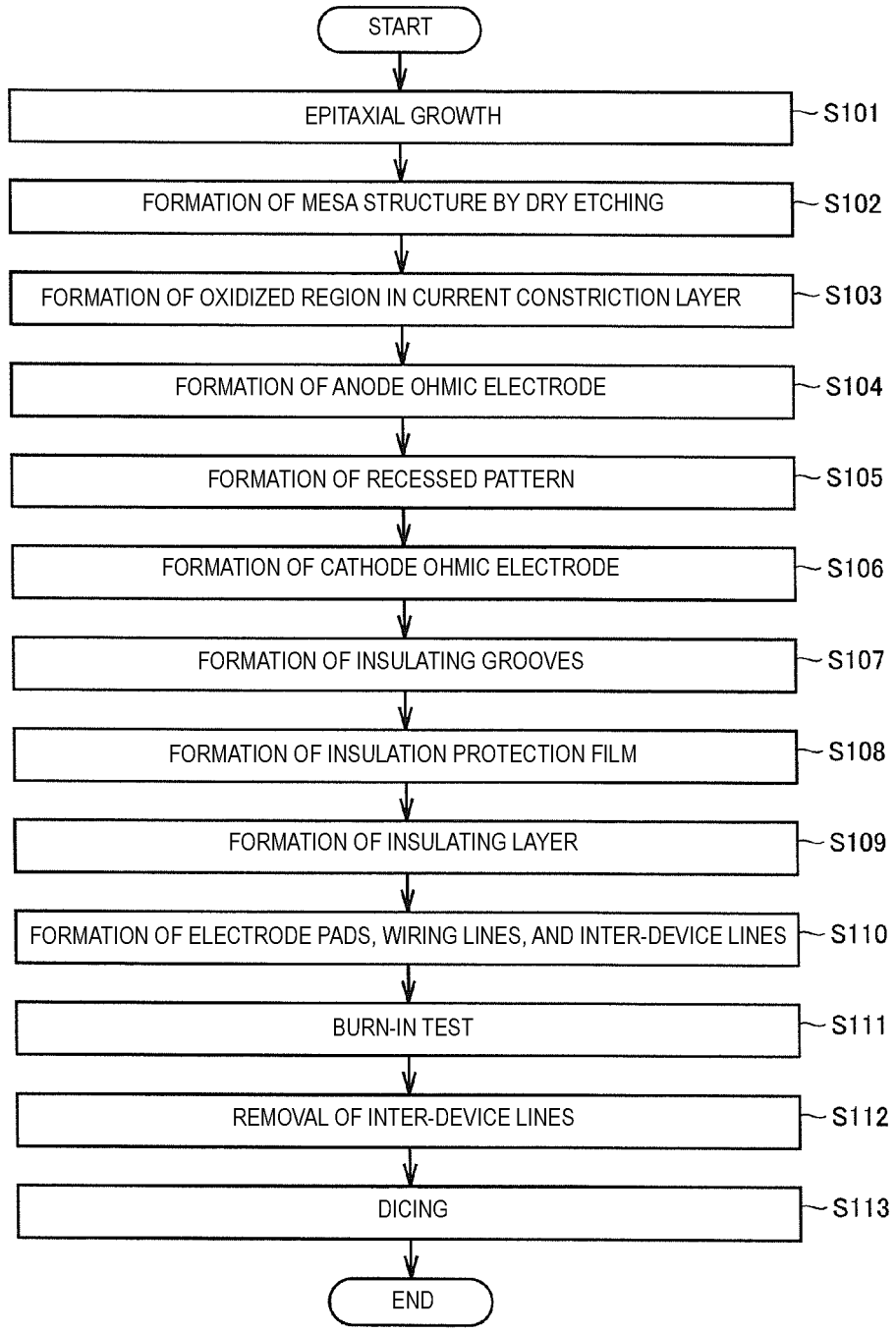
FIG. 6 is a flowchart used to describe a method for manufacturing the vertical cavity surface emitting laser array illustrated in FIG. 1.

FIG. 6 is a flowchart used to describe a method for manufacturing the VCSEL array 101 illustrated in FIG. 1. FIGS. 7 to 17 are schematic diagrams illustrating the steps of the method for manufacturing the VCSEL array 101 illustrated in FIG. 1. The VCSEL devices 1 to 3 are simultaneously manufactured by the same steps, and FIGS. 7 to 17 illustrate the steps for manufacturing the VCSEL device 2 as a representative. In the following description, the step numbers in the flowchart of FIG. 6 are shown in parentheses.

Figure 7:
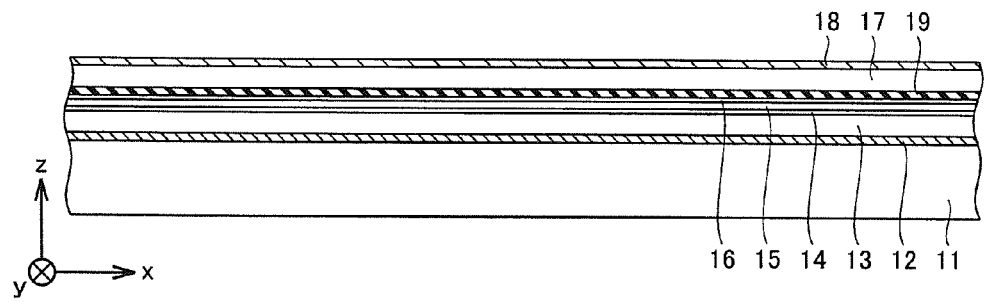
FIG. 7 is a schematic diagram illustrating an epitaxial growth step in the method for manufacturing the vertical cavity surface emitting laser array illustrated in FIG. 1.

Referring to FIG. 7, first, the n-type contact layer 12, the n-type DBR layer 13, the n-type cladding layer 14, the active layer 15, the p-type cladding layer 16, the current constriction layer 19, the p-type DBR layer 17, and the p-type contact layer 18 are formed in that order on the front surface of the base substrate 11 by epitaxial growth (step S101).

The epitaxial growth may be carried out by, for example, metal organic chemical vapor deposition (MOCVD) or molecular beam epitaxy (MBE). The temperature and time for the epitaxial growth are appropriately determined in accordance with, for example, the growth method, the type of the base substrate 11, or the type, thickness, or carrier density of each layer.

Figure 8:
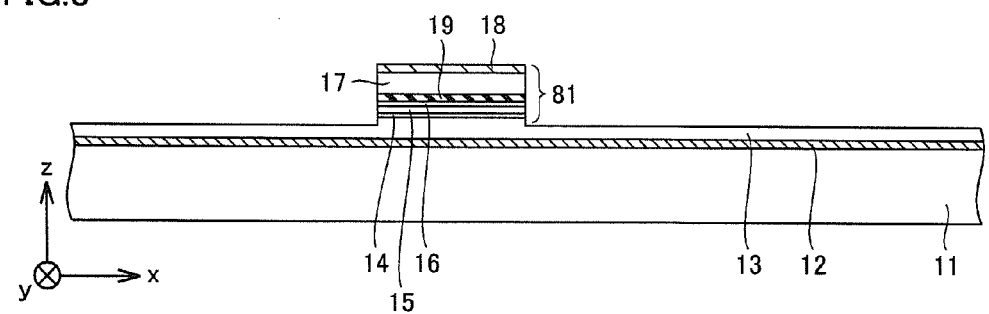
FIG. 8 is a schematic diagram illustrating photolithography and dry etching step in the method for manufacturing the vertical cavity surface emitting laser array illustrated in FIG. 1.

Referring to FIG. 8, the pattern of the layers between the p-type contact layer 18 and the n-type cladding layer 14 is formed by, for example, photolithography. In the region other than the region in which the pattern is formed, the layers from the p-type contact layer 18 to the n-type cladding layer 14 are successively removed by dry etching so that the n-type DBR layer 13 is exposed. Thus, a mesa structure 81 is formed (step S102).

Figure 9:
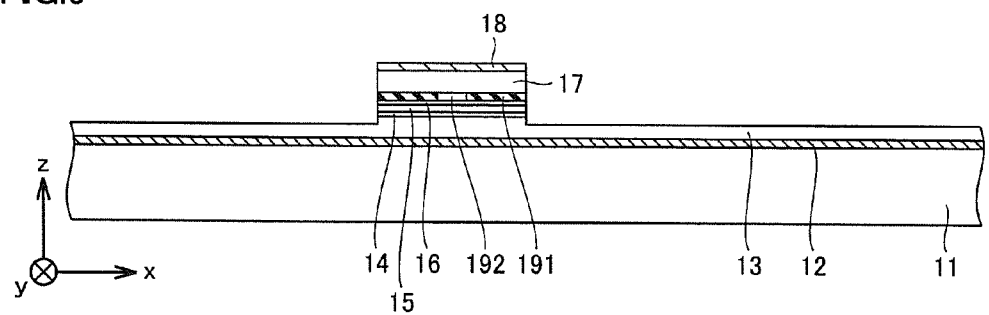
FIG. 9 is a schematic diagram illustrating an oxidized-region forming step in the method for manufacturing the vertical cavity surface emitting laser array illustrated in FIG. 1.

Referring to FIG. 9, a heating process in which the temperature is increased to 400° C. or more is performed in, for example, a water vapor atmosphere so that the current constriction layer 19 is selectively oxidized from an outer peripheral portion thereof. Thus, the oxidized region 191 and the non-oxidized region 192 are formed (step S103).

Figure 10:
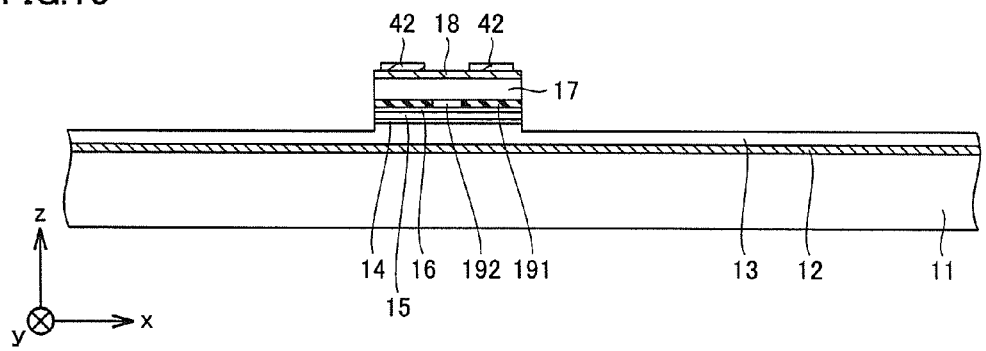
FIG. 10 is a schematic diagram illustrating an anode-ohmic-electrode forming step in the method for manufacturing the vertical cavity surface emitting laser array illustrated in FIG. 1.

Referring to FIG. 10, the anode ohmic electrode 42 is formed on the p-type contact layer 18 (step S104).

Figure 11:
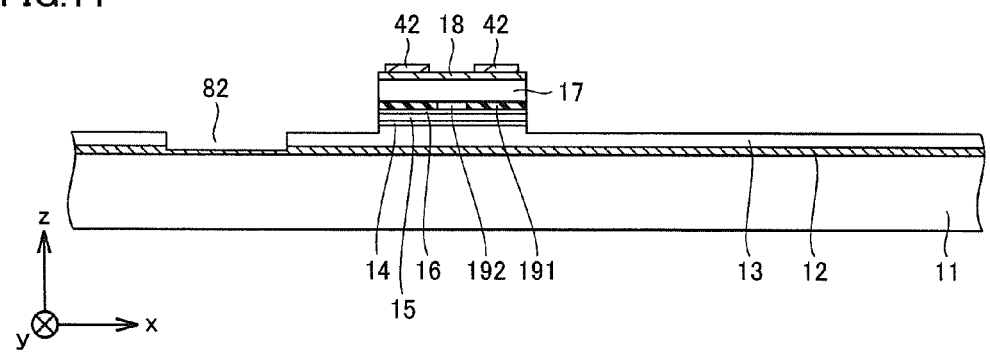
FIG. 11 is a schematic diagram illustrating a recessed-pattern forming step in the method for manufacturing the vertical cavity surface emitting laser array illustrated in FIG. 1.

Referring to FIG. 11, in the present embodiment, the n-type contact layer 12 is located closer to the back side of the base substrate 11 than the n-type DBR layer 13 is. Accordingly, a recessed pattern 82 is formed by photolithography and etching. As a result, the n-type contact layer 12 is exposed (step S105).

Figure 12:
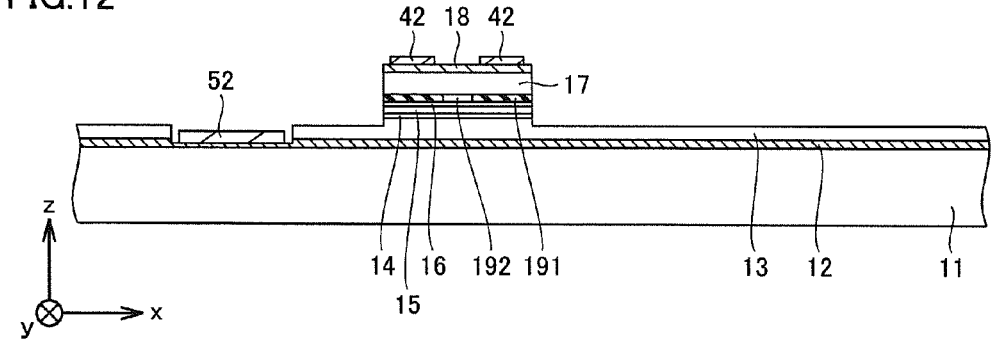
FIG. 12 is a schematic diagram illustrating a cathode-ohmic-electrode forming step in the method for manufacturing the vertical cavity surface emitting laser array illustrated in FIG. 1.

Referring to FIG. 12, the cathode ohmic electrode 52 is formed on a portion of the n-type contact layer 12 that is exposed (step S106).

Figure 13:
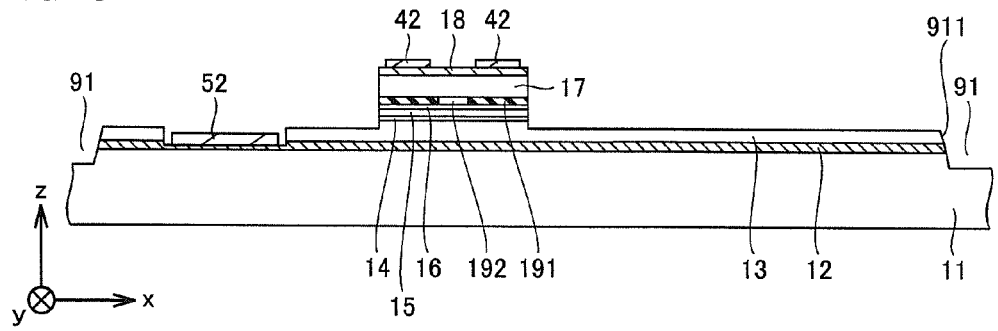
FIG. 13 is a schematic diagram illustrating an insulating-groove forming step in the method for manufacturing the vertical cavity surface emitting laser array illustrated in FIG. 1.

Referring to FIG. 13, the insulating grooves 91 are formed between the VCSEL devices 1 and 2 and between the VCSEL devices 2 and 3 (see FIG. 2) (step S107).

Figure 14:
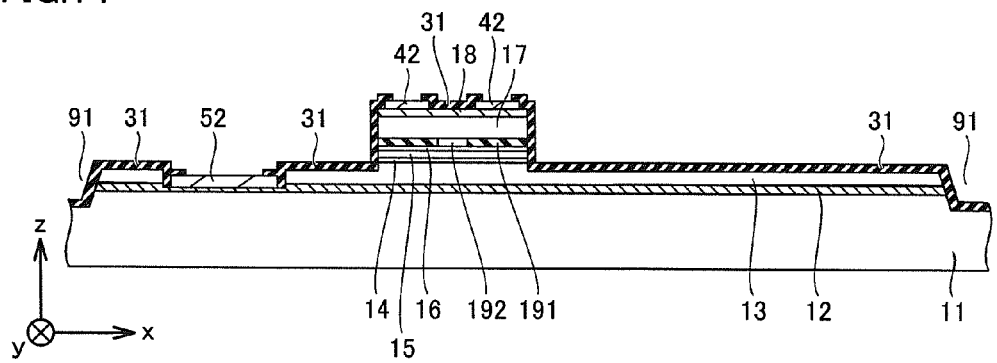
FIG. 14 is a schematic diagram illustrating an insulation-protection-film forming step in the method for manufacturing the vertical cavity surface emitting laser array illustrated in FIG. 1.

Referring to FIG. 14, the insulation protection film 31 is formed on the front surface of each of structural components other than the anode ohmic electrode 42 and the cathode ohmic electrode 52, the structural components being formed in the above-described steps (step S108). More specifically, a SiN film may be formed by chemical vapor deposition (CVD).

In the case where the insulation protection film 31 is not formed, there is a possibility that an extremely small leak current (see FIG. 5B) will flow along the surfaces of the insulating grooves 91 that are exposed. The leak current that flows along the surfaces of the insulating grooves 91 can be suppressed by performing a passivation process (process in step S108). Therefore, the electrical insulation between the VCSEL devices that are adjacent to each other with the insulating grooves 91 provided therebetween can be further enhanced.

The cross sections of the insulating grooves 91 preferably have a forward tapered shape. In other words, the cross sectional areas of the insulating grooves 91 preferably decrease along the direction from the front side to the back side of the base substrate 11 (negative z direction in FIG. 3). In such a case, side walls 911 of the insulating grooves 91 can be more reliably coated with the insulation protection film 31.

Figure 15:
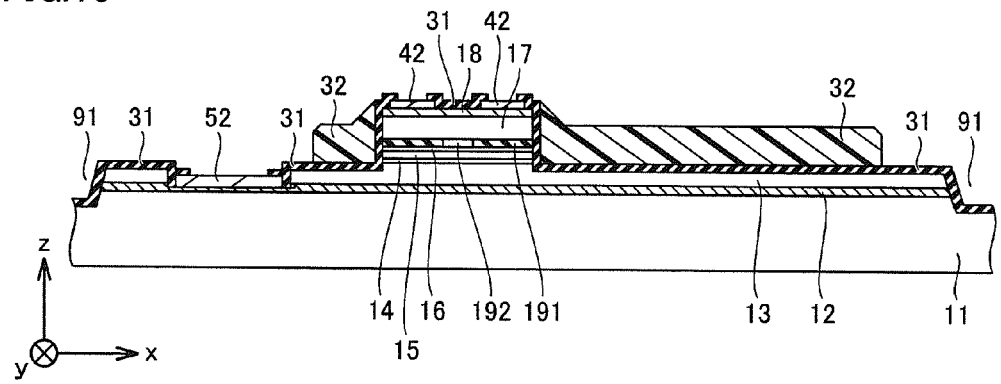
FIG. 15 is a schematic diagram illustrating an insulating-layer forming step in the method for manufacturing the vertical cavity surface emitting laser array illustrated in FIG. 1.

Referring to FIG. 15, the insulating layer 32 is formed on the insulation protection film 31 in a region near the mesa structure 81 (step S109). The insulating layer 32 may be formed by, for example, applying photosensitive polyimide to the insulation protection film 31 by spin coating. Then, photolithography and curing are performed.

Figure 16:
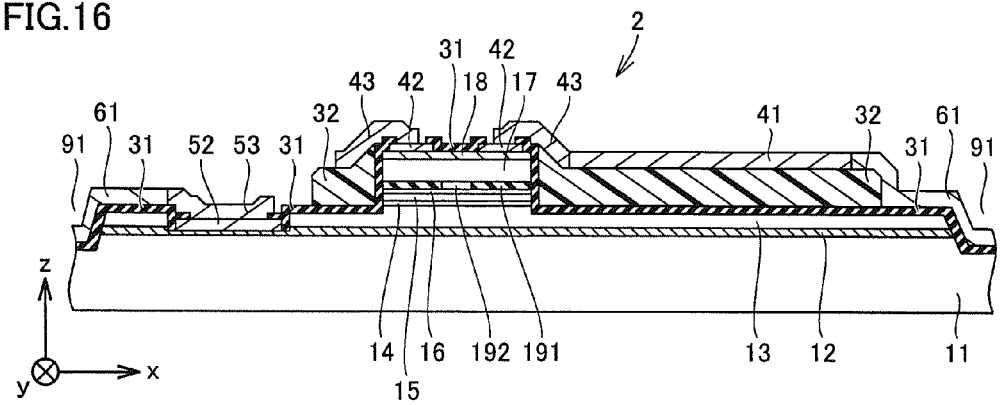
FIG. 16 is a schematic diagram illustrating a step of forming electrode pads and wiring lines in the method for manufacturing the vertical cavity surface emitting laser array illustrated in FIG. 1.

Referring to FIG. 16, the electrode pads for wire bonding and the wiring lines (anode wiring line 43 and cathode wiring lines 53, see FIG. 1) are formed (step S110). In addition, in the present embodiment, the inter-device lines 61 are formed together with the electrode pads and wiring lines to reduce the number of steps.

The inter-device lines 61 are preferably formed by sputtering film formation, plating, or the combination thereof so that the inter-device lines 61 reliably adheres to the side walls 911 of the insulating grooves 91. Titanium (Ti) and gold (Au), for example, may be used as the material of the inter-device lines 61.

Next, the load current If is supplied from the external current source 64 (see FIG. 4), and a burn-in test is performed. Tests other than the burn-in test may also be performed as necessary (step S111).

Figure 17:
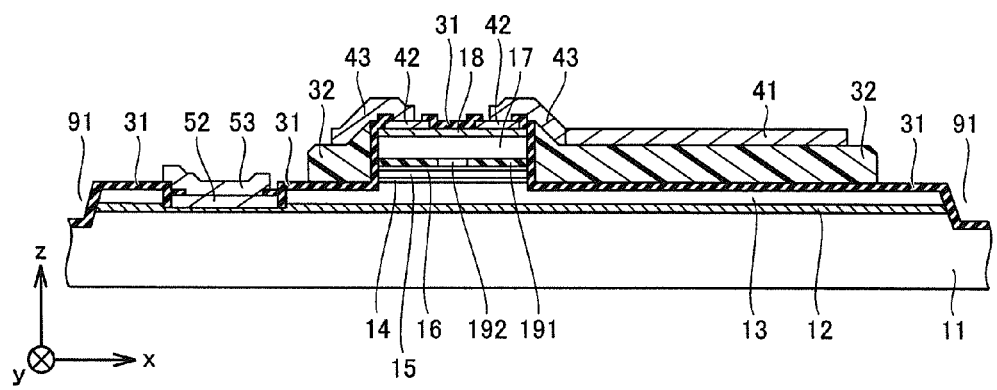
FIG. 17 is a schematic diagram illustrating an inter-device-line removing step in the method for manufacturing the vertical cavity surface emitting laser array illustrated in FIG. 1.

Referring to FIG. 17, after the tests are completed, the inter-device lines 61 are removed by photolithography and etching (step S112). Preferably, only the inter-device lines 61 are removed while the insulation protection film 31 is left unetched in the etching process. For example, a solution of potassium iodide (KI) and a solution of hydrofluoric nitric acid (HF+HNO$_3$) selectively remove portions of the inter-device lines 61 that are made of Au and Ti. Therefore, when the insulation protection film 31 is made of SiN, only the inter-device lines can be removed while the insulation protection film 31 is left unetched.

Lastly, the VCSEL array 101 is divided into separate VCSEL devices by, for example, dicing (step S113). To make efficient use of the area of the wafer on which the VCSEL array 101 is formed (that is, the area of the base substrate 11), the dicing may be performed in the regions in which the insulating grooves 91 are formed. In such a case, portions of the insulation protection film 31 formed on the insulating grooves 91 have preferably been removed. The insulation protection film may be removed by, for example, performing etching after photolithography. Thus, abrasion of the dicing blade can be suppressed and the impact on the VCSEL devices during dicing can be reduced. When the process of step S113 is finished, the series of processes is completed.

The process of removing the inter-device lines (process in step S112) may be omitted, and the wafer may be diced into separate VCSEL devices (step S113) while the inter-device lines are present. In this case, remainders of the inter-device lines that are cut by dicing can be observed on the separate VCSEL devices. For example, portions of the inter-device lines 61 illustrated in FIG. 1 remain on the separate VCSEL devices.

A process of placing a sealing material or a piece of tape over the entire back surface of the wafer may be performed before the process of separating the VCSEL devices from each other (process in step S113). The dicing may be performed such that the wafer is cut but the sealing material or the piece of tape on the back surface of the wafer is not cut. In such a case, the separate VCSEL devices can be handled together in such a state that the VCSEL devices are arranged in an array. Thus, the VCSEL devices can be easily handled during shipping, transportation, or mounting.

Second Embodiment

The structure for enhancing the electrical insulation between the VCSEL devices that are adjacent to each other is not limited to the insulating grooves. In a second embodiment, high resistance regions are formed by ion implantation.

Figure 18:
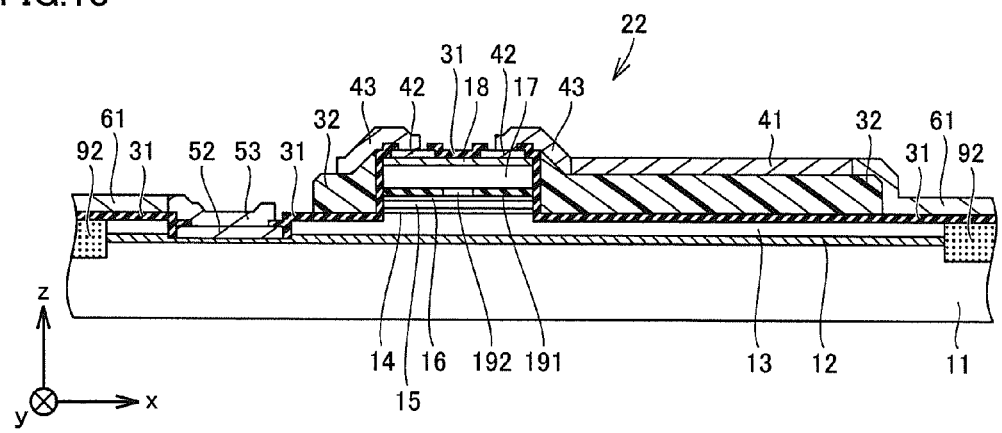
FIG. 18 is a sectional view of a vertical cavity surface emitting laser device included in a vertical cavity surface emitting laser array according to a second embodiment of the present disclosure.

FIG. 18 is a sectional view of a VCSEL device 22 included in a VCSEL array according to a second embodiment of the present disclosure. The VCSEL array illustrated in FIG. 18 differs from the VCSEL 101 illustrated in FIG. 2 in that high resistance regions 92 are provided instead of the insulating grooves 91.

The high resistance regions 92 are formed by ion implantation. Accordingly, the high resistance regions 92 have an electrical resistivity higher than the electrical resistivity of the base substrate 11 (for example, 1.0×10$^7$ Ω·cm or more). The structures of other portions of the VCSEL device 22 are the same as those of the corresponding portions of the VCSEL device 2, and detailed description thereof will not be repeated.

Figure 19:
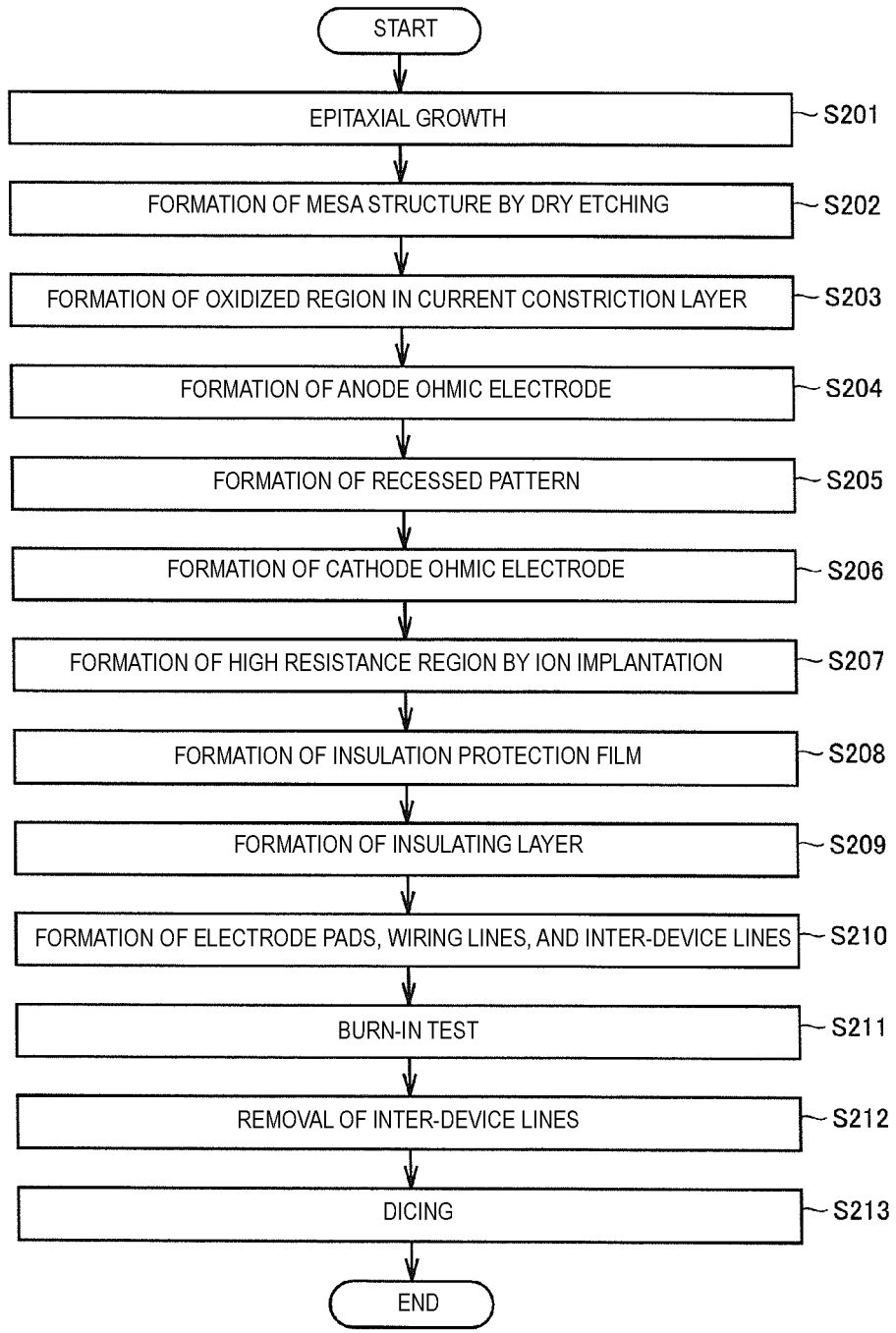
FIG. 19 is a flowchart used to describe a method for manufacturing the vertical cavity surface emitting laser array including the vertical cavity surface emitting laser device illustrated in FIG. 18.

FIG. 19 is a flowchart used to describe a method for manufacturing the VCSEL array including the VCSEL device 22 illustrated in FIG. 18. FIGS. 20 to 24 are schematic diagrams illustrating the steps of the method for manufacturing the VCSEL array including the VCSEL device 22 illustrated in FIG. 18.

Referring to FIG. 19, processes in steps S201 to S206 are the same as those in step S101 to S106 in FIG. 6 (that is, processes illustrated in FIGS. 7 to 12), and detailed description thereof will not be repeated. In the following description, the step numbers in the flowchart of FIG. 19 are shown in parentheses.

Figure 20:
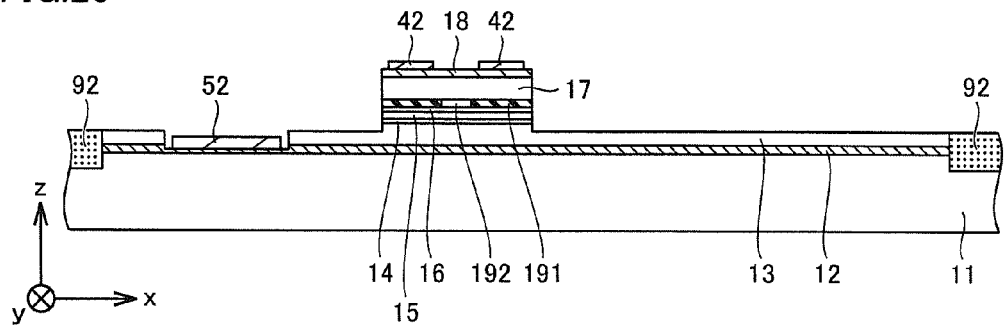
FIG. 20 is a schematic diagram illustrating a step of forming a high resistance region by ion implantation in the method for manufacturing the vertical cavity surface emitting laser array including the vertical cavity surface emitting laser device illustrated in FIG. 18.

Referring to FIG. 20, high resistance regions 92 that extend into the base substrate 11 are formed between the VCSEL devices by ion implantation (step S207). As a result of the ion implantation, the high resistance regions 92 have an electrical resistivity higher than that of the base substrate 11. The high resistance regions 92 are formed to divide the n-type DBR layer 13 and the n-type contact layer 12.

Figure 21:
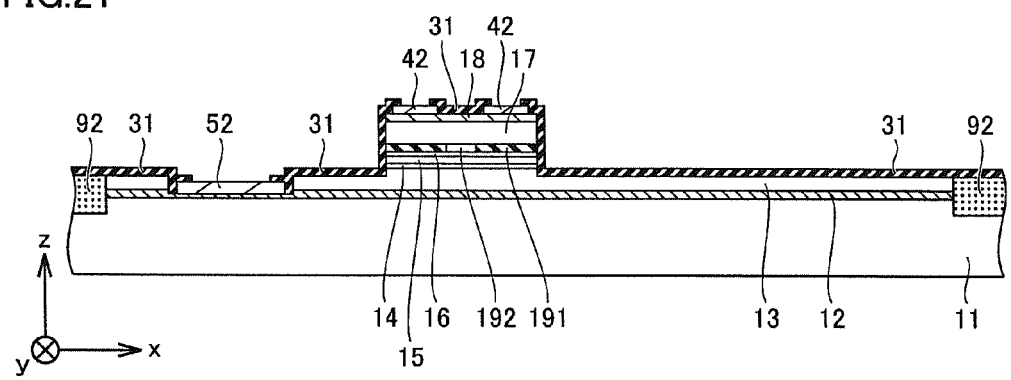
FIG. 21 is a schematic diagram illustrating an insulation-protection-film forming step in the method for manufacturing the vertical cavity surface emitting laser array including the vertical cavity surface emitting laser device illustrated in FIG. 18.

Referring to FIG. 21, the insulation protection film 31 is formed on the front surface of each of the structural components other than the anode ohmic electrode 42 and the cathode ohmic electrode 52 (step S208).

Figure 22:
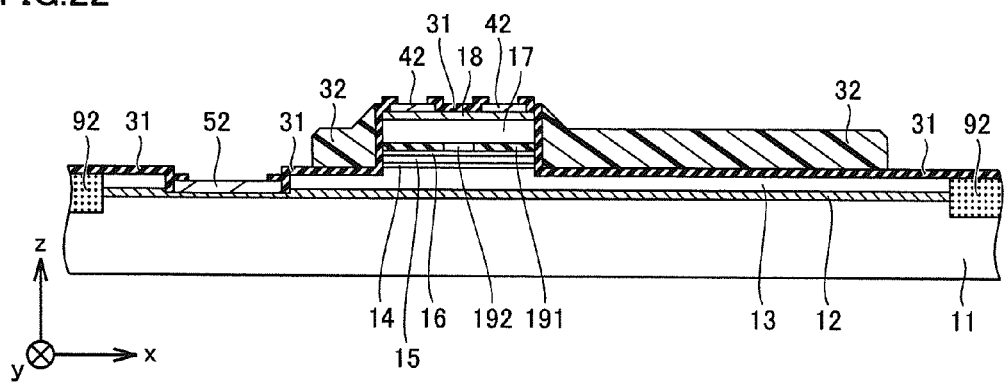
FIG. 22 is a schematic diagram illustrating an insulating-layer forming step in the method for manufacturing the vertical cavity surface emitting laser array including the vertical cavity surface emitting laser device illustrated in FIG. 18.

Referring to FIG. 22, the insulating layer 32 is formed on the insulation protection film 31 in a region near the mesa structure 81 (step S209).

Figure 23:
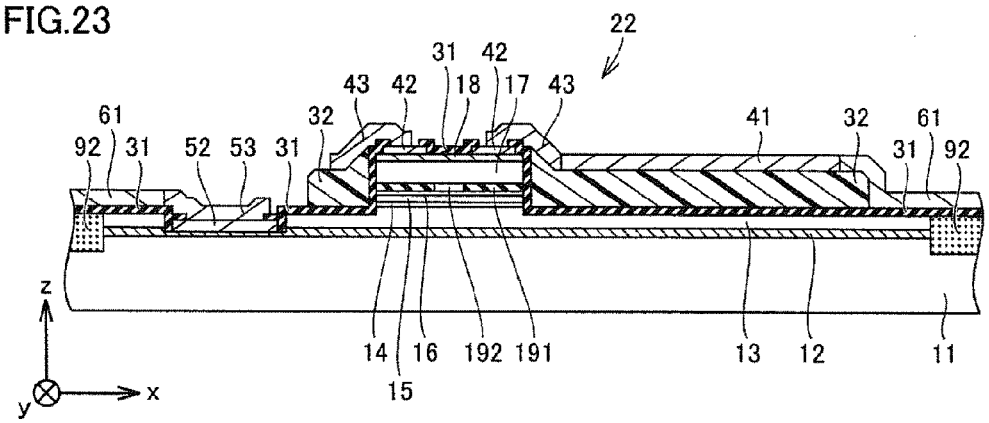
FIG. 23 is a schematic diagram illustrating a step of forming electrode pads and wiring lines in the method for manufacturing the vertical cavity surface emitting laser array including the vertical cavity surface emitting laser device illustrated in FIG. 18.

Referring to FIG. 23, the electrode pads for wire bonding, the wiring lines, and the inter-device lines 61 are formed (step S210). Then, a burn-in test is performed (step S211).

Figure 24:
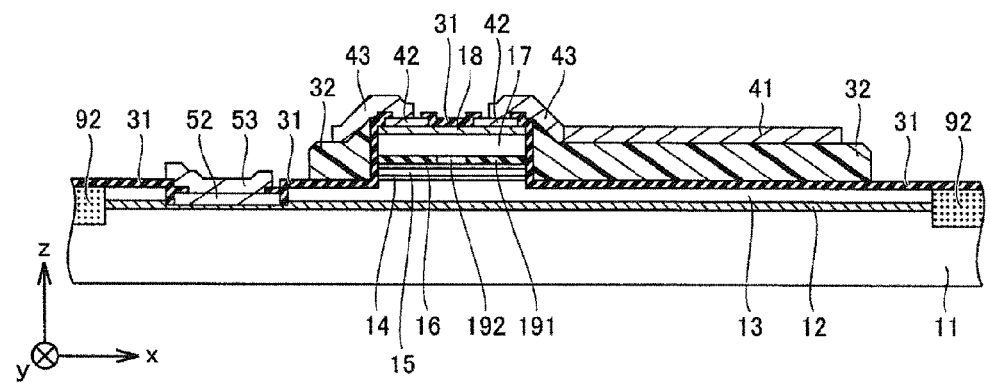
FIG. 24 is a schematic diagram illustrating an inter-device-line removing step in the method for manufacturing the vertical cavity surface emitting laser array including the vertical cavity surface emitting laser device illustrated in FIG. 18.

Referring to FIG. 24, after the burn-in test is completed, the inter-device lines 61 are selectively removed by photolithography and etching (step S212). Lastly, the VCSEL array is diced into separate VCSEL devices (step S213). When the process of step S213 is finished, the series of processes is completed.

According to the present embodiment, the electrical insulation between the VCSEL devices is enhanced by the high resistance regions 92. Accordingly, a leak current does not easily flow between the VCSEL devices through a semiconductor layer. This enables the VCSEL devices to receive a uniform load current If, so that an accurate burn-in test can be performed. In addition, since the VCSEL devices can be tested simultaneously and the number of probes included in the burn-in device can be reduced, the cost of the burn-in test can be reduced. Moreover, since no steps like the insulating grooves are formed, the inter-device lines 61 and the insulation protection film 31 can be easily formed. In the first and second embodiments, the conductive types of the base substrate 11 and each semiconductor layer (p-type and n-type) may be inverted.

Third Embodiment

In the first and second embodiments, the base substrate is composed of a semi-insulating semiconductor substrate. However, the type of the base substrate is not limited to this. In the present embodiment, a conductive or semiconductive semiconductor substrate is used.

Figure 25:
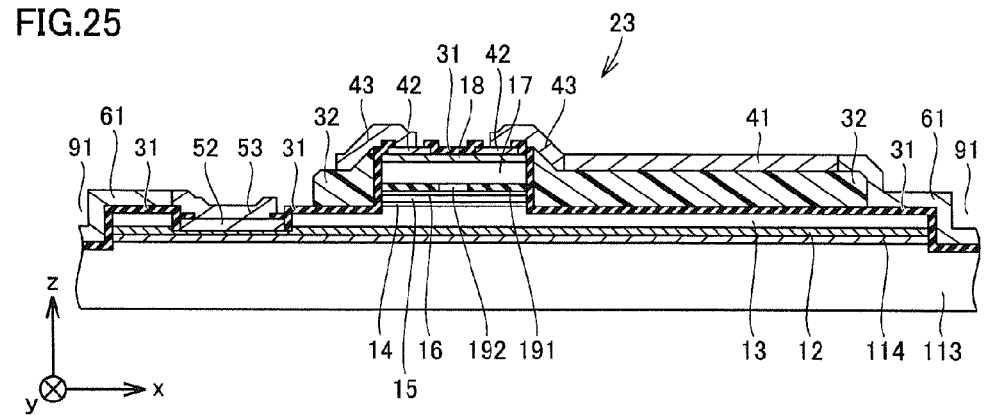
FIG. 25 is a sectional view of a vertical cavity surface emitting laser device included in a vertical cavity surface emitting laser array according to a third embodiment of the present disclosure.

FIG. 25 is a sectional view of a VCSEL device 23 included in a VCSEL array according to a third embodiment of the present disclosure. The VCSEL array illustrated in FIG. 25 differs from the VCSEL array 101 illustrated in FIG. 2 in that a conductive or semiconductive base substrate 113 is provided instead of the base substrate 11, and a p-type conductive semiconductor layer 114 is disposed between the base substrate 113 and the n-type contact layer 12.

The p-type conductive semiconductor layer 114 and the n-type contact layer 12 form a p-n junction. The forward direction of the p-n junction is the direction opposite to the direction of the load current If (negative z direction, see FIG. 5B). This makes it difficult for the load current If to reach the base substrate 113. Accordingly, even though the base substrate 113 is composed of a conductive or semiconductive semiconductor substrate, a leak current does not easily flow between the VCSEL devices. The structures of other portions of the VCSEL device 23 are the same as those of the corresponding portions of the VCSEL device 2, and description thereof will not be repeated. Although the insulating grooves 91 illustrated in FIG. 25 are formed so as to be perpendicular to the base substrate 113, the insulating grooves 91 may instead have a forward tapered shape (see FIG. 3). When the insulating grooves 91 have a forward tapered shape, the insulating grooves 91 can be more reliably coated with the insulation protection film 31 or the like.

FIGS. 26 to 36 are schematic diagrams illustrating the steps of a method for manufacturing the VCSEL array including the VCSEL device 23 illustrated in FIG. 25. A flowchart used to describe the steps illustrated in FIGS. 26 to 36 is the same as the flowchart illustrated in FIG. 6.

Figure 26:
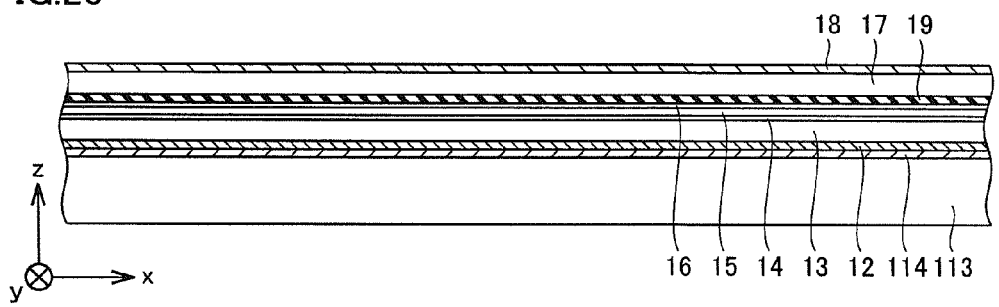
FIG. 26 is a schematic diagram illustrating an epitaxial growth step in the method for manufacturing the vertical cavity surface emitting laser array including the vertical cavity surface emitting laser device illustrated in FIG. 25.

Referring to FIG. 26, first, the p-type conductive semiconductor layer 114, the n-type contact layer 12, the n-type DBR layer 13, the n-type cladding layer 14, the active layer 15, the p-type cladding layer 16, the current constriction layer 19, the p-type DBR layer 17, and the p-type contact layer 18 are formed in that order on the front surface of the conductive or semiconductive base substrate 113 by epitaxial growth (step S101).

Figure 27:
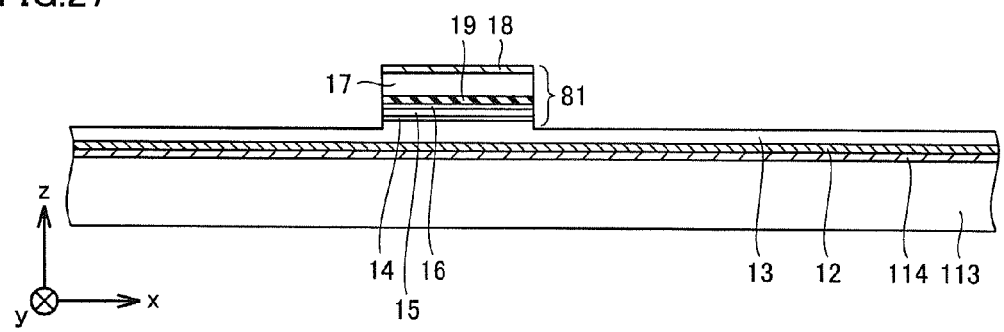
FIG. 27 is a schematic diagram illustrating photolithography and dry etching step in the method for manufacturing the vertical cavity surface emitting laser array including the vertical cavity surface emitting laser device illustrated in FIG. 25.

Referring to FIG. 27, the layers from the p-type contact layer 18 to the n-type cladding layer 14 are successively removed by dry etching, so that the mesa structure 81 is formed (step S102).

Figure 28:
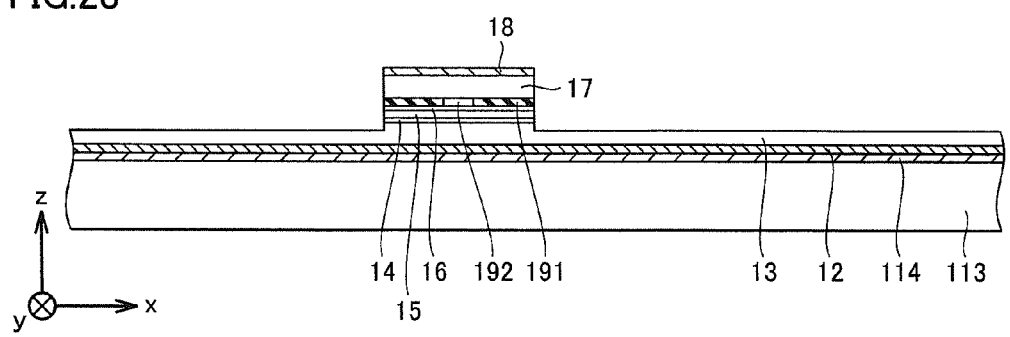
FIG. 28 is a schematic diagram illustrating an oxidized-region forming step in the method for manufacturing the vertical cavity surface emitting laser array including the vertical cavity surface emitting laser device illustrated in FIG. 25.

Referring to FIG. 28, a heating process in which the temperature is increased to 400° C. or more is performed in, for example, a water vapor atmosphere so that the oxidized region 191 and the non-oxidized region 192 are formed (step S103).

Figure 29:
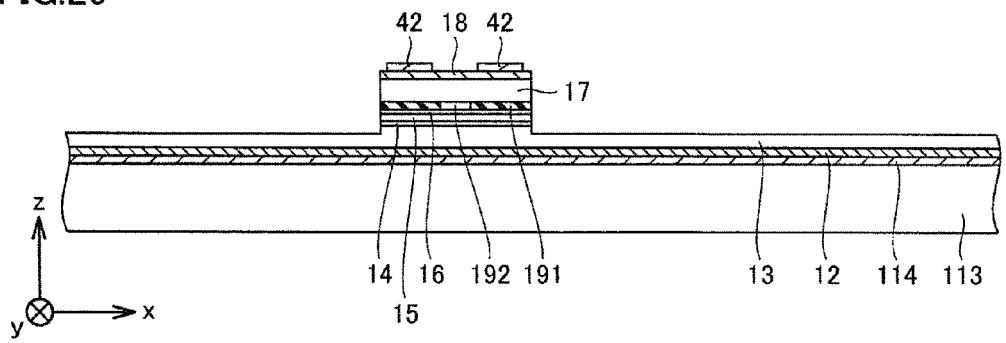
FIG. 29 is a schematic diagram illustrating an anode-ohmic-electrode forming step in the method for manufacturing the vertical cavity surface emitting laser array including the vertical cavity surface emitting laser device illustrated in FIG. 25.

Referring to FIG. 29, the anode ohmic electrode 42 is formed on the front surface of the p-type contact layer 18 (step S104).

Figure 30:
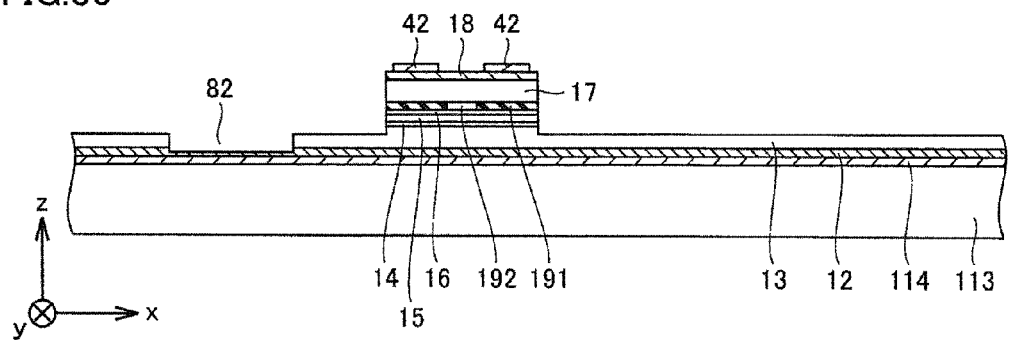
FIG. 30 is a schematic diagram illustrating a recessed-pattern forming step in the method for manufacturing the vertical cavity surface emitting laser array including the vertical cavity surface emitting laser device illustrated in FIG. 25.

Referring to FIG. 30, the recessed pattern 82 is formed by photolithography and etching so that the n-type contact layer 12 is exposed (step S105).

Figure 31:
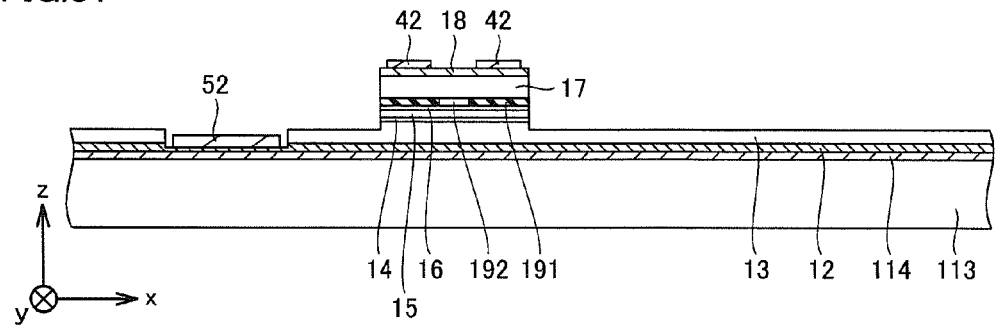
FIG. 31 is a schematic diagram illustrating a cathode-ohmic-electrode forming step in the method for manufacturing the vertical cavity surface emitting laser array including the vertical cavity surface emitting laser device illustrated in FIG. 25.

Referring to FIG. 31, the cathode ohmic electrode 52 is formed on a portion of the n-type contact layer 12 that is exposed (step S106).

Figure 32:
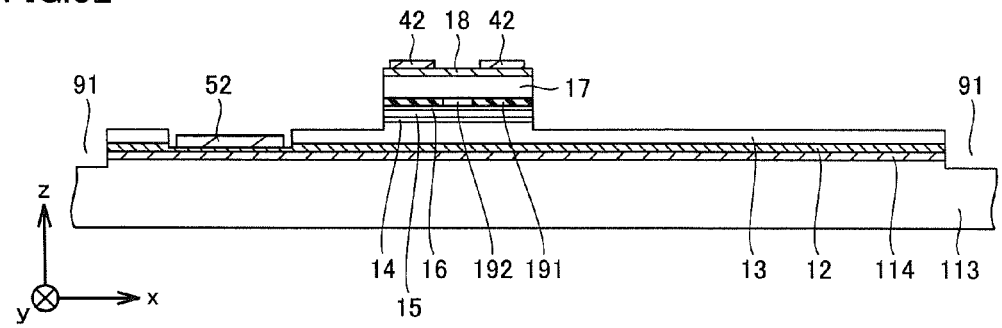
FIG. 32 is a schematic diagram illustrating an insulating-groove forming step in the method for manufacturing the vertical cavity surface emitting laser array including the vertical cavity surface emitting laser device illustrated in FIG. 25.

Referring to FIG. 32, the insulating grooves 91, which are shaped so as to be recessed into the base substrate 113 from the front side of the base substrate 113, are formed between the VCSEL devices 1 and 2 and between the VCSEL devices 2 and 3 (see FIG. 2) (step S107). The insulating grooves 91 divide the n-type DBR layer 13, the n-type contact layer 12, and the p-type conductive semiconductor layer 114.

Figure 33:
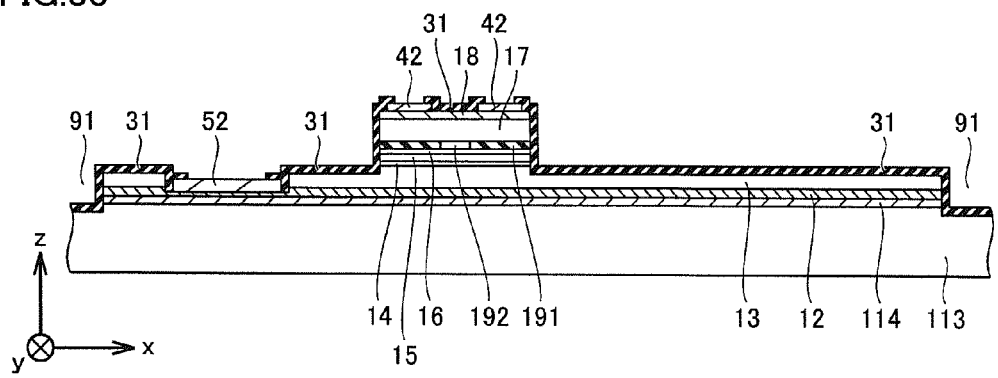
FIG. 33 is a schematic diagram illustrating an insulation-protection-film forming step in the method for manufacturing the vertical cavity surface emitting laser array including the vertical cavity surface emitting laser device illustrated in FIG. 25.

Referring to FIG. 33, the insulation protection film 31 is formed on the front surface of each of structural components other than the front surfaces of the anode ohmic electrode 42 and the cathode ohmic electrode 52, the structural components being formed in the above-described steps (step S108).

Figure 34:
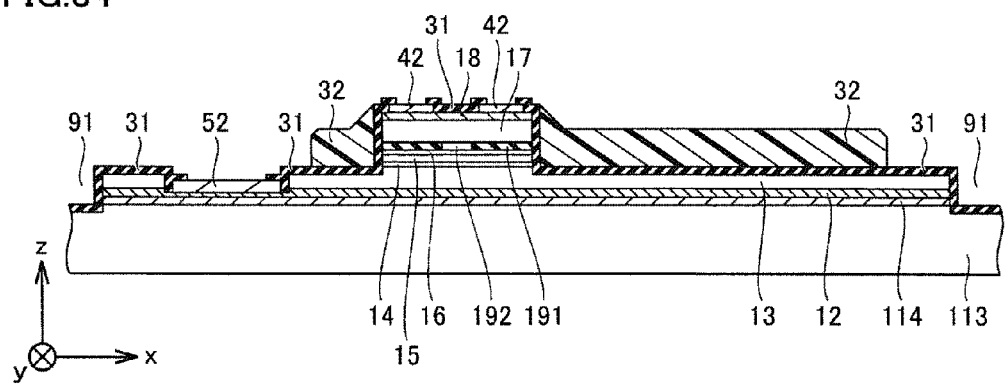
FIG. 34 is a schematic diagram illustrating an insulating-layer forming step in the method for manufacturing the vertical cavity surface emitting laser array including the vertical cavity surface emitting laser device illustrated in FIG. 25.

Referring to FIG. 34, the insulating layer 32 is formed on the front surface of the insulation protection film 31 in a region near the mesa structure 81 (step S109).

Figure 35:
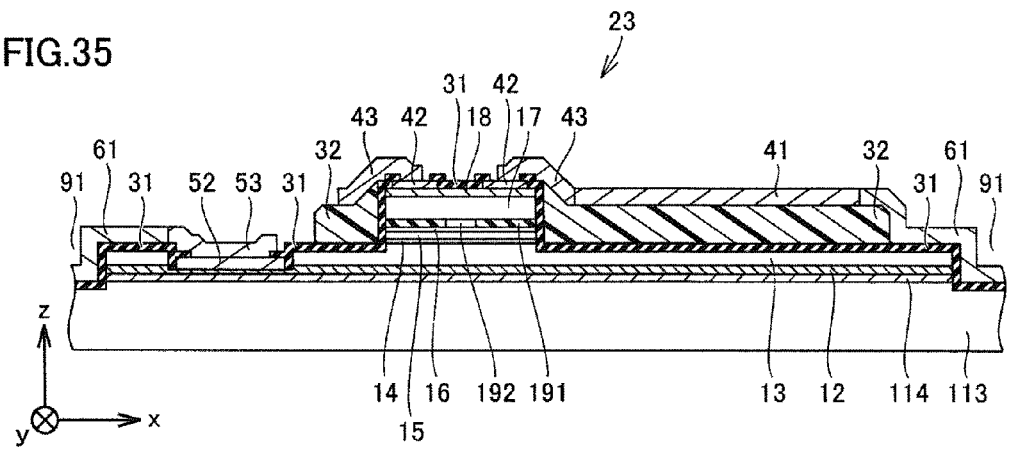
FIG. 35 is a schematic diagram illustrating a step of forming electrode pads and wiring lines in the method for manufacturing the vertical cavity surface emitting laser array including the vertical cavity surface emitting laser device illustrated in FIG. 25.

Referring to FIG. 35, the electrode pads for wire bonding, the wiring lines, and the inter-device lines 61 are formed (step S110). Then, a burn-in test is performed (step S111).

Figure 36:
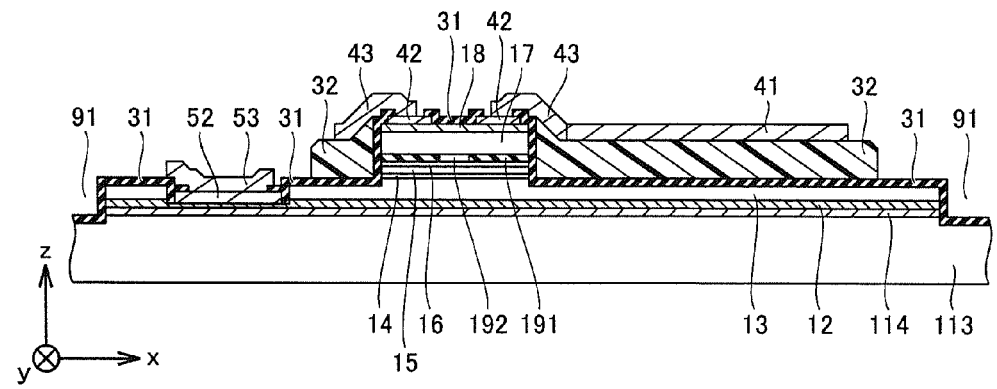
FIG. 36 is a schematic diagram illustrating an inter-device-line removing step in the method for manufacturing the vertical cavity surface emitting laser array including the vertical cavity surface emitting laser device illustrated in FIG. 25.

Referring to FIG. 36, the inter-device lines 61 are selectively removed by photolithography and etching (step S112). Lastly, the VCSEL array is diced into separate VCSEL devices (step S113). When the process of step S113 is finished, the series of processes is completed.

According to the present embodiment, similar to the first and second embodiments, the VCSEL devices can receive a uniform load current If, and therefore an accurate burn-in test can be performed. In addition, the cost of the burn-in test can be reduced. Moreover, since the base substrate is not limited to a semi-insulating substrate and a conductive or semiconductive substrate can be used, the degree of freedom in selecting the substrate is improved. As a result, the degree of freedom in designing characteristics of the VCSEL devices, for example, is improved.

Fourth Embodiment

The high resistance regions formed by ion implantation may be configured such that the high resistance regions divide a p-type conductive semiconductor layer.

Figure 37:
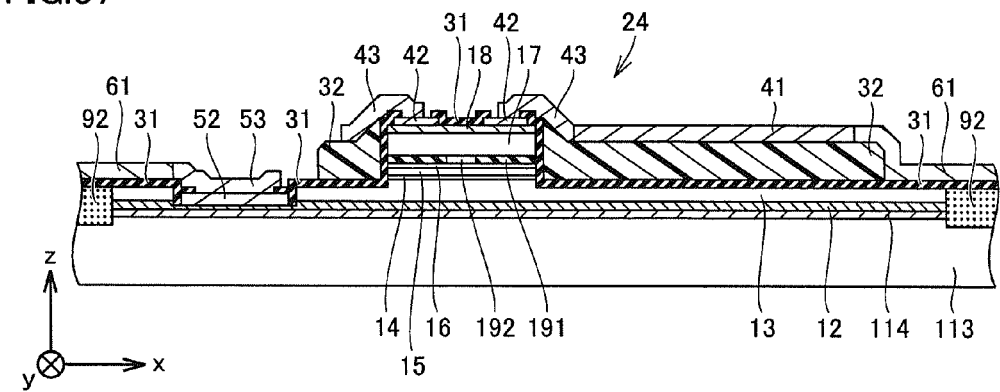
FIG. 37 is a sectional view of a vertical cavity surface emitting laser device included in a vertical cavity surface emitting laser array according to a fourth embodiment of the present disclosure.

FIG. 37 is a sectional view of a VCSEL device included in a VCSEL array according to a fourth embodiment of the present disclosure. FIGS. 38 to 42 are schematic diagrams illustrating the steps of a method for manufacturing the VCSEL array including the VCSEL device 24 illustrated in FIG. 37.

Figure 38:
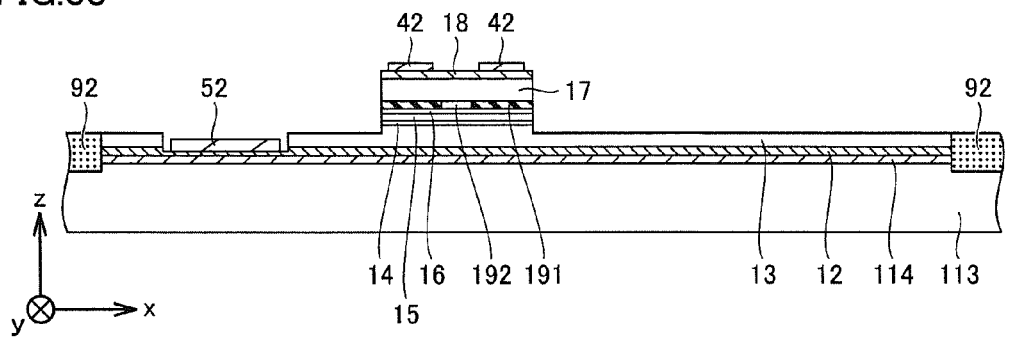
FIG. 38 is a schematic diagram illustrating a step of forming a high resistance region by ion implantation in the method for manufacturing the vertical cavity surface emitting laser array including the vertical cavity surface emitting laser device illustrated in FIG. 37.

The steps performed prior to the step illustrated in FIG. 38 are the same as those in the third embodiment (see FIGS. 26 to 31), and description thereof will not be repeated. A flowchart used to describe the steps illustrated in FIGS. 38 to 42 is the same as the flowchart illustrated in FIG. 19.

Referring to FIG. 38, the high resistance regions 92 are formed between the VCSEL devices by ion implantation (step S207). The high resistance regions 92 extend into the base substrate 113 so as to divide the n-type DBR layer 13, the n-type contact layer 12, and the p-type conductive semiconductor layer 114.

Figure 39:
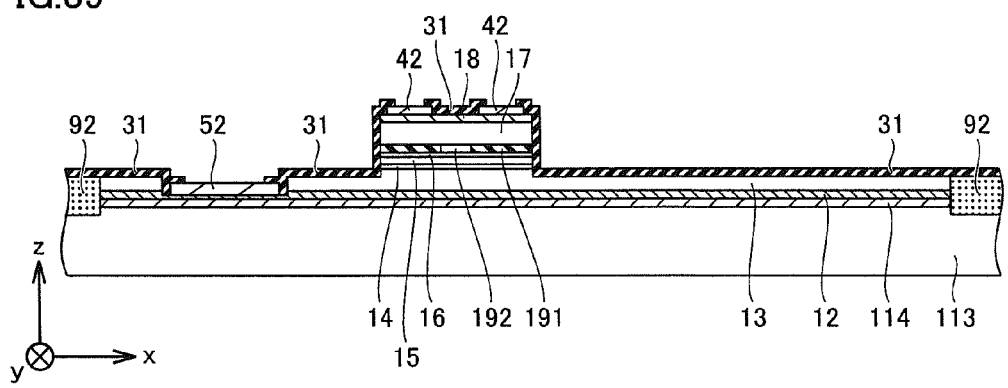
FIG. 39 is a schematic diagram illustrating an insulation-protection-film forming step in the method for manufacturing the vertical cavity surface emitting laser array including the vertical cavity surface emitting laser device illustrated in FIG. 37.

Referring to FIG. 39, the insulation protection film 31 is formed on the front surface of each of structural components other than the front surfaces of the anode ohmic electrode 42 and the cathode ohmic electrode 52, the structural components being formed in the above-described steps (step S208).

Figure 40:
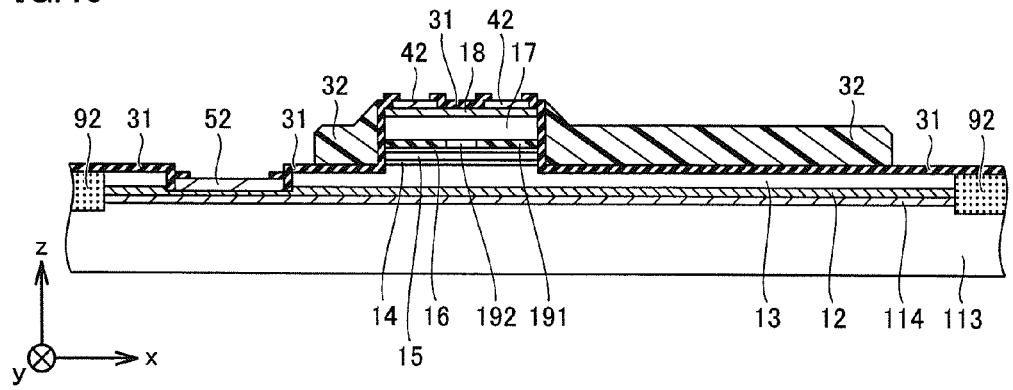
FIG. 40 is a schematic diagram illustrating an insulating-layer forming step in the method for manufacturing the vertical cavity surface emitting laser array including the vertical cavity surface emitting laser device illustrated in FIG. 37.

Referring to FIG. 40, the insulating layer 32 is formed on the front surface of the insulation protection film 31 in a region near the mesa structure 81 (step S209).

Figure 41:
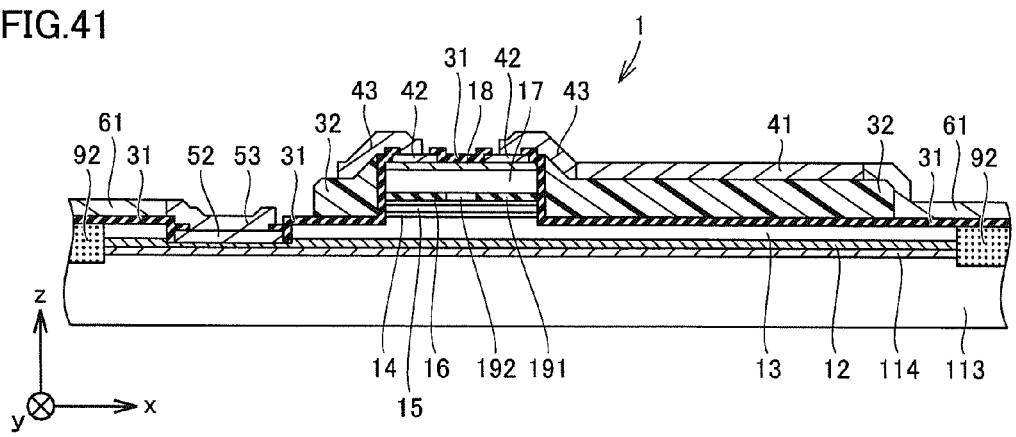
FIG. 41 is a schematic diagram illustrating a step of forming electrode pads and wiring lines in the method for manufacturing the vertical cavity surface emitting laser array including the vertical cavity surface emitting laser device illustrated in FIG. 37.

Referring to FIG. 41, the electrode pads for wire bonding, the wiring lines, and the inter-device lines 61 are formed (step S210). Then, a burn-in test is performed (step S211).

Figure 42:
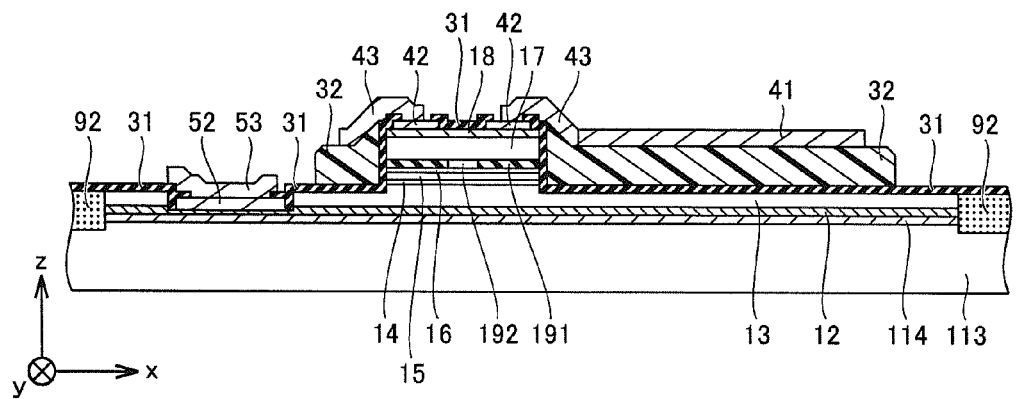
FIG. 42 is a schematic diagram illustrating an inter-device-line removing step in the method for manufacturing the vertical cavity surface emitting laser array including the vertical cavity surface emitting laser device illustrated in FIG. 37.

Referring to FIG. 42, the inter-device lines 61 are selectively removed by photolithography and etching (step S212). Lastly, the VCSEL array is diced into separate VCSEL devices (step S213). When the process of step S213 is finished, the series of processes is completed.

According to the present embodiment, similar to the first to third embodiments, an accurate and low-cost burn-in test is realized. In addition, similar to the second embodiment, since no steps like the insulating grooves are formed, the inter-device lines 61 and the insulation protection film 31 can be easily formed.

In the description of the first to fourth embodiments, the p-type and n-type conductivities respectively correspond to the "first conductivity type" and the "second conductivity type" according to the present disclosure. However, the conductivity types of the semiconductor layers may be switched so that the p-type corresponds to the "second conductivity type" according to the present disclosure and the n-type to the "first conductivity type" according to the present disclosure. In other words, in the first to fourth embodiments, semiconductor layers may be formed such that an n-type conductive semiconductor layer, a p-type contact layer, a p-type DBR layer, an active region, an n-type DBR layer, and an n-type contact layer are stacked upward in that order on a base substrate. Accordingly, the anode electrodes, the cathode electrodes, etc., are changed as appropriate.

In the first to fourth embodiments, AlGaAs-based semiconductor materials are described. However, semiconductor materials that can be used in the present disclosure are not limited to this, and other materials, such as GaInP-based, ZnSSe-based, InGaN-based, AlGaN-based, InGaAs-based, GaInNAs-based, or GaAsSb-based semiconductor materials, may instead be used in accordance with the oscillation wavelength.

The presently disclosed embodiments are illustrative in all points and should not be considered as limiting. The scope of the present disclosure is defined by the scope of the claims and it is intended that equivalents to the scope of the claims and all modifications within the scope be included within the scope of the present disclosure.

The invention claimed is:

1. A vertical cavity surface emitting laser array comprising:
   a semi-insulating semiconductor substrate;
   a plurality of vertical cavity surface emitting laser devices formed on a front side of the semi-insulating semiconductor substrate; and
   an inter-device line that connects n (n is a natural number≥2) of the plurality of vertical cavity surface emitting laser devices that are adjacent to each other, the n vertical cavity surface emitting laser devices being connected in series such that forward directions of the n vertical cavity surface emitting laser devices are the same,
   wherein an insulating region that electrically insulates the n vertical cavity surface emitting laser devices is formed on the semi-insulating semiconductor substrate
   when a resistance value of the insulating region formed between two adjacent VCSEL devices is expressed by $R_{ISO}$, a following formula is satisfied, $$I_{LEAK} = (Vf \times n)/R_{ISO} < If \times 0.1\%,$$

wherein $I_{LEAK}$ is a leak current, Vf is a value of a load voltage applied to each of the vertical cavity surface emitting laser devices connected in series, and If is a load current.

2. The vertical cavity surface emitting laser array according to claim 1,
   wherein the insulating region is an insulating groove that is shaped so as to be recessed into the semi-insulating semiconductor substrate from the front side of the semi-insulating semiconductor substrate.

3. The vertical cavity surface emitting laser array according to claim 2, wherein an insulation protection film is formed on a front surface of the insulating groove.

4. The vertical cavity surface emitting laser array according to claim 3, wherein the insulation protection film is a film made of silicon nitride.

5. The vertical cavity surface emitting laser array according to claim 2, wherein the insulating groove has a forward tapered shape such that a cross sectional area of the insulating groove decreases along a direction from the front side to a back side of the semi-insulating semiconductor substrate.

6. The vertical cavity surface emitting laser array according to claim 1,
   wherein the insulating region is a high resistance region formed to divide a layer that is provided on the semi-insulating semiconductor substrate and on which the n vertical cavity surface emitting laser devices are formed, the high resistance region having an electrical resistivity higher than an electrical resistivity of the semi-insulating semiconductor substrate.

7. The vertical cavity surface emitting laser array according to claim 1,
   wherein each of the plurality of vertical cavity surface emitting laser devices includes
   an active region, and
   a first-conductivity-type semiconductor multilayer-film reflective layer and a second-conductivity-type semiconductor multilayer-film reflective layer that sandwich the active region,
   wherein the second-conductivity-type semiconductor multilayer-film reflective layer is provided between the first-conductivity-type semiconductor multilayer-film reflective layer and the semi-insulating semiconductor substrate,
   wherein the semi-insulating semiconductor substrate includes a first-conductivity-type conductive semiconductor layer formed so as to extend from the front surface toward a back side of the semi-insulating semiconductor substrate, and
   wherein the insulating region is an insulating groove that is shaped so as to be recessed into the first-conductivity-type conductive semiconductor layer from the front side of the semi-insulating semiconductor substrate.

8. The vertical cavity surface emitting laser array according to claim 1,
   wherein each of the plurality of vertical cavity surface emitting laser devices includes
   an active region, and
   a first-conductivity-type semiconductor multilayer-film reflective layer and a second-conductivity-type semiconductor multilayer-film reflective layer that sandwich the active region,
   wherein the second-conductivity-type semiconductor multilayer-film reflective layer is provided between the first-conductivity-type semiconductor multilayer-film reflective layer and the semi-insulating semiconductor substrate,
   wherein the semi-insulating semiconductor substrate includes a first-conductivity-type conductive semiconductor layer formed so as to extend from the front surface toward a back side of the semi-insulating semiconductor substrate, and
   wherein the insulating region includes a high resistance region formed to divide the first-conductivity-type conductive semiconductor layer, the high resistance region having an electrical resistivity higher than an electrical resistivity of the first-conductivity-type conductive semiconductor layer.

9. A method for manufacturing a vertical cavity surface emitting laser array, comprising:
   forming a plurality of vertical cavity surface emitting laser devices on a front side of a semi-insulating semiconductor substrate;
   forming an insulating region between n (n is a natural number≥2) of the plurality of vertical cavity surface emitting laser devices that are adjacent to each other, the insulating region electrically insulating the n vertical cavity surface emitting laser devices; and
   forming an inter-device line after the step of forming the insulating region, the inter-device line connecting the n vertical cavity surface emitting laser devices in series such that forward directions of the n vertical cavity surface emitting laser devices are the same when a resistance value of the insulating region formed between two adjacent VCSEL devices is expressed by $R_{ISO}$, a following formula is satisfied, $$I_{LEAK}=(Vf\times n)/R_{ISO}<If\times 0.1\%,$$

wherein $I_{LEAK}$ is a leak current, Vf is a value of a load voltage applied to each of the vertical cavity surface emitting laser devices connected in series, and If is a load current.

10. The method for manufacturing a vertical cavity surface emitting laser array according to claim 9,
wherein the forming of the insulating region includes forming an insulating groove that is shaped so as to be recessed into the semi-insulating semiconductor substrate from the front side of the semi-insulating semiconductor substrate.

11. The method for manufacturing a vertical cavity surface emitting laser array according to claim 9,
wherein the forming of the insulating region includes forming a high resistance region by ion implantation to divide a layer that is provided on the semi-insulating semiconductor substrate and on which the n vertical cavity surface emitting laser devices are formed, the high resistance region having an electrical resistivity higher than an electrical resistivity of the semi-insulating semiconductor substrate.

12. The method for manufacturing a vertical cavity surface emitting laser array according to claim 10, further comprising:
performing a burn-in test in which a load current is supplied to the n vertical cavity surface emitting laser devices through the inter-device line; and
removing the inter-device line after the step of performing the burn-in test.

13. The method for manufacturing a vertical cavity surface emitting laser array according to claim 10,
wherein each of the plurality of vertical cavity surface emitting laser devices includes
an anode electrode and a cathode electrode,
an anode electrode pad and a cathode electrode pad formed for wire bonding,
an anode wire that electrically connects the anode electrode and the anode electrode pad, and
a cathode wire that electrically connects the cathode electrode and the cathode electrode pad, and
wherein the forming the inter-device line includes forming the anode electrode pad, the cathode electrode pad, the anode wire, and the cathode wire simultaneously with the inter-device line.

14. The method for manufacturing a vertical cavity surface emitting laser array according to claim 10, wherein the forming the inter-device line includes forming the inter-device line by at least one of sputtering film formation or plating.

15. A vertical cavity surface emitting laser array comprising:
a semiconductor substrate;
a plurality of vertical cavity surface emitting laser devices formed on a front side of the semiconductor substrate; and
an inter-device line that connects n (n is a natural number≥2) of the plurality of vertical cavity surface emitting laser devices that are adjacent to each other, the n vertical cavity surface emitting laser devices being connected in series such that forward directions of the n vertical cavity surface emitting laser devices are the same,
wherein an insulating region that electrically insulates the n vertical cavity surface emitting laser devices is formed on the semiconductor substrate, the insulating region being an ion implanted region formed to divide a layer that is provided on the semiconductor substrate and on which the n vertical cavity surface emitting laser devices are formed, the high resistance region having an electrical resistivity higher than an electrical resistivity of the semiconductor substrate,
when a resistance value of the insulating region formed between two adjacent VCSEL devices is expressed by $R_{ISO}$, a following formula is satisfied $$I_{LEAK}=(Vf\times n)/R_{ISO}<If\times 0.1\%,$$

wherein $I_{LEAK}$ is a leak current, Vf is a value of a load voltage applied to each of the vertical cavity surface emitting laser devices connected in series, and If is a load current.

16. A method for manufacturing a vertical cavity surface emitting laser array, comprising:
forming a plurality of vertical cavity surface emitting laser devices on a front side of a semiconductor substrate;
forming an insulating region including a high resistance region between n (n is a natural number≥2) of the plurality of vertical cavity surface emitting laser devices that are adjacent to each other, the insulating region electrically insulating the n vertical cavity surface emitting laser devices; and
forming an inter-device line after the step of forming the insulating region, the inter-device line connecting the n vertical cavity surface emitting laser devices in series such that forward directions of the n vertical cavity surface emitting laser devices are the same, wherein
the forming of the insulating region includes forming a high resistance region by ion implantation to divide a layer that is provided on the semiconductor substrate and on which the n vertical cavity surface emitting laser devices are formed, the high resistance region having an electrical resistivity higher than an electrical resistivity of the semiconductor substrate,
when a resistance value of the insulating region formed between two adjacent VCSEL devices is expressed by $R_{ISO}$, a following formula is satisfied $$I_{LEAK}=(Vf\times n)/R_{ISO}<If\times 0.1\%,$$

wherein $I_{LEAK}$ is leak current, Vf is load voltage applied to each of the vertical cavity surface emitting laser devices connected in series, and If is load current.

* * * * *